United States Patent
Katsumata et al.

(10) Patent No.: US 8,294,191 B2
(45) Date of Patent: Oct. 23, 2012

(54) MULTI-LAYER MEMORY DEVICE INCLUDING VERTICAL AND U-SHAPE CHARGE STORAGE REGIONS

(75) Inventors: Ryota Katsumata, Mie-ken (JP); Hideaki Aochi, Kanagawa-ken (JP); Masaru Kito, Kanagawa-ken (JP); Masaru Kidoh, Tokyo (JP); Ryouhei Kirisawa, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 83 days.

(21) Appl. No.: 12/943,349

(22) Filed: Nov. 10, 2010

(65) Prior Publication Data

US 2012/0043599 A1   Feb. 23, 2012

(30) Foreign Application Priority Data

Aug. 20, 2010 (JP) ................... 2010-184818

(51) Int. Cl.
H01L 29/792 (2006.01)
(52) U.S. Cl. ................. 257/314; 257/326; 257/E29.309
(58) Field of Classification Search .................. 257/316, 257/326, 319, E27.102
See application file for complete search history.

(56) References Cited

U.S. PATENT DOCUMENTS

2007/0252201 A1  11/2007  Kito et al.
2009/0121271 A1*  5/2009  Son et al. ...................... 257/315
2010/0207195 A1  8/2010  Fukuzumi et al.
2012/0001250 A1*  1/2012  Alsmeier ...................... 257/319

OTHER PUBLICATIONS

U.S. Appl. No. 12/886,132, filed Sep. 20, 2010, Yahashi, et al.
U.S. Appl. No. 12/839,895, filed Jul. 20, 2010, Fukuzumi, et al.
U.S. Appl. No. 12/727,854, filed Mar. 19, 2010, Kito, et al.

* cited by examiner

Primary Examiner — Marcos D Pizarro Crespo
Assistant Examiner — Cesar Lopez
(74) Attorney, Agent, or Firm — Oblon, Spivak, McClelland, Maier & Neustadt, L.L.P.

(57) ABSTRACT

According to one embodiment, a nonvolatile semiconductor memory device includes a first and a second stacked structure, a first and a second semiconductor pillar, a semiconductor connection portion, a first and a second connection portion conductive layer, a first and a second pillar portion memory layer, a first and a second connection portion memory layer. The first and second stacked structures include electrode films and inter-electrode insulating films alternately stacked in a first direction. The second stacked structure is adjacent to the first stacked structure. The first and second semiconductor pillars pierce the first and second stacked structures, respectively. The semiconductor connection portion connects the first and second semiconductor pillars. The first and second pillar portion memory layers are provided between the electrode films and the semiconductor pillar. The first and second connection portion memory layers are provided between the connection portion conductive layers and the semiconductor connection portion.

16 Claims, 12 Drawing Sheets

MULTI-LAYER MEMORY DEVICE INCLUDING VERTICAL AND U-SHAPE CHARGE STORAGE REGIONS

CROSS-REFERENCE TO RELATED APPLICATIONS

This application is based upon and claims the benefit of priority from the prior Japanese Patent Application No. 2010-184818, filed on Aug. 20, 2010; the entire contents of which are incorporated herein by reference.

FIELD

Embodiments described herein relate generally to a nonvolatile semiconductor memory device and a method for manufacturing the same.

BACKGROUND

In conventional nonvolatile semiconductor memory devices, elements have been integrated in a two-dimensional plane on a silicon substrate. Although the dimensions of one element have been reduced in order to increase the memory capacity of memory, such downscaling is becoming difficult these days in terms of cost and technology.

In contrast, collectively processed three-dimensionally stacked memory is presented. The collectively processed three-dimensionally stacked memory includes a stacked structure body including alternately stacked insulating films and electrode films, silicon pillars piercing the stacked structure body, and charge storage layers (memory layers) between the silicon pillars and the electrode films. Thereby, a memory cell is provided at the intersection of the silicon pillar and each electrode film. Further, also a configuration is presented using a memory string having a U-shaped configuration in which two silicon pillars are connected on the substrate side. The collectively processed three-dimensionally stacked memory like this leaves room for improvement to further increase memory capacity.

DETAILED DESCRIPTION

Figure 1:
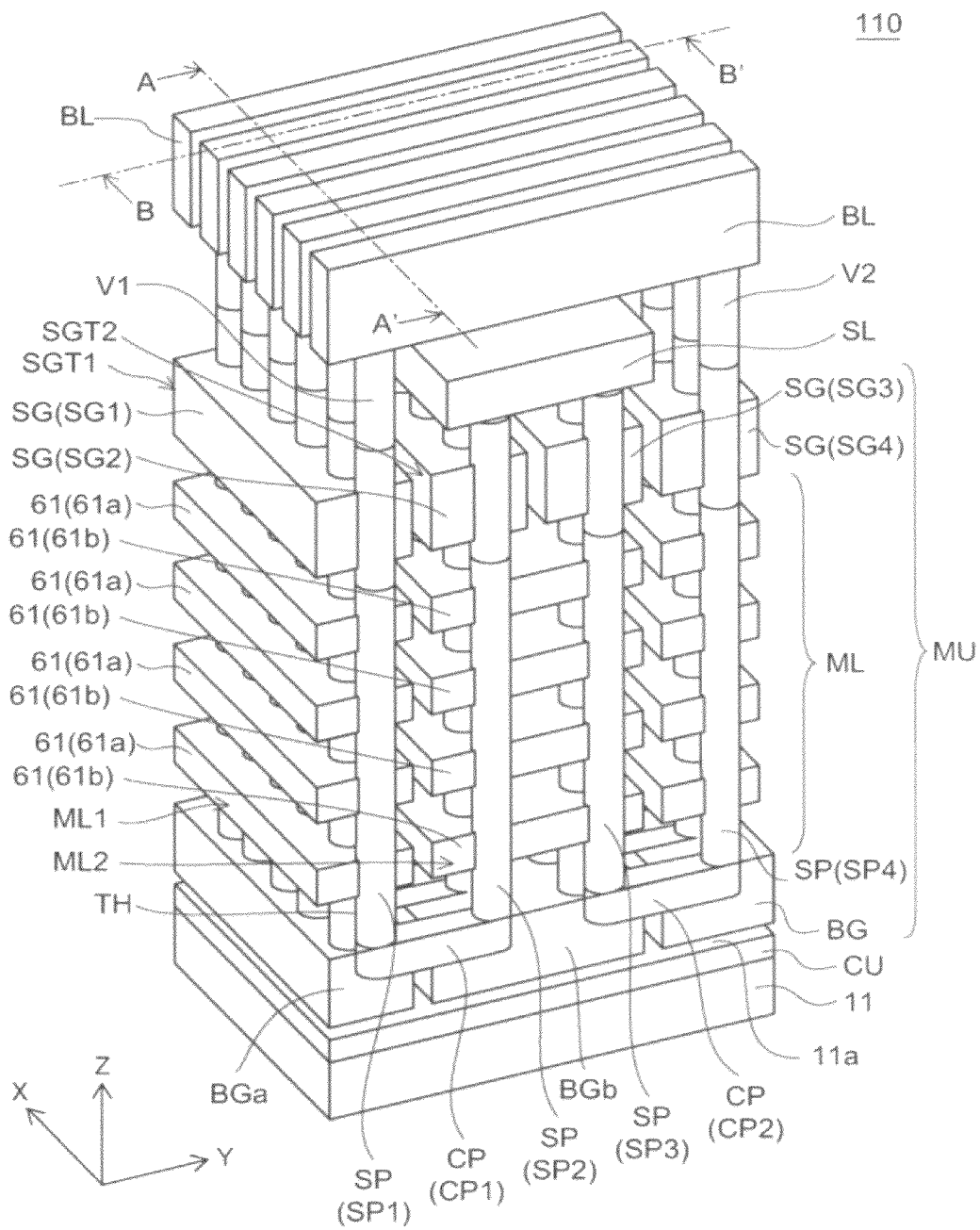
FIG. 1 is a schematic perspective view illustrating the configuration of a nonvolatile semiconductor memory device according to a first embodiment.

In general, according to one embodiment, a nonvolatile semiconductor memory device includes a first stacked structure body, a second stacked structure body, a first semiconductor pillar, a second semiconductor pillar, a semiconductor connection portion, a first connection portion conductive layer, a second connection portion conductive layer, a first pillar portion memory layer, a second pillar portion memory layer, a first connection portion memory layer and a second connection portion memory layer. The first stacked structure body includes a plurality of first electrode films and a plurality of first inter-electrode insulating films alternately stacked in a first direction. The second stacked structure body adjacent to the first stacked structure body in a second direction perpendicular to the first direction includes a plurality of second electrode films and a plurality of second inter-electrode insulating films alternately stacked in the first direction. The first semiconductor pillar pierces the first stacked structure body in the first direction. The second semiconductor pillar pierces the second stacked structure body in the first direction. The semiconductor connection portion connects one end of the first semiconductor pillar and one end of the second semiconductor pillar. The first connection portion conductive layer is opposed to a first portion of the semiconductor connection portion on the first semiconductor pillar side. The second connection portion conductive layer is opposed to a second portion of the semiconductor connection portion on the second semiconductor pillar side. The first pillar portion memory layer is provided between the plurality of first electrode films and the first semiconductor pillar. The second pillar portion memory layer is provided between the plurality of second electrode films and the second semiconductor pillar. The first connection portion memory layer is provided between the first connection portion conductive layer and the semiconductor connection portion. The second connection portion memory layer is provided between the second connection portion conductive layer and the semiconductor connection portion.

According to one embodiment, a method is disclosed for manufacturing a nonvolatile semiconductor memory device. The device includes a first stacked structure body, a second stacked structure body, a first semiconductor pillar, a second semiconductor pillar, a semiconductor connection portion, a first connection portion conductive layer, a second connection portion conductive layer, a first pillar portion memory layer, a second pillar portion memory layer, a first connection portion memory layer, a second connection portion memory layer, a first pillar portion outer insulating film, a second pillar portion outer insulating film, a first connection portion outer insulating film and a second connection portion outer insulating film. The first stacked structure body includes a plurality of first electrode films and a plurality of first inter-electrode insulating films alternately stacked in a first direction. The second stacked structure body adjacent to the first stacked structure body in a second direction perpendicular to the first direction includes a plurality of second electrode films and a plurality of second inter-electrode insulating films alternately stacked in the first direction. The first semiconductor pillar pierces the first stacked structure body in the first direction. The second semiconductor pillar pierces the second stacked structure body in the first direction. The semiconductor connection portion connects one end of the first semiconductor pillar and one end of the second semiconductor pillar. The first connection portion conductive layer is opposed to a first portion of the semiconductor connection portion on the first semiconductor pillar side. The second connection portion conductive layer is opposed to a second portion of the semiconductor connection portion on the second semiconductor pillar side. The first pillar portion memory layer provided between the plurality of first electrode films and the first semiconductor pillar. The second pillar portion memory layer is provided between the plurality of second electrode films and the second semiconductor pillar. The first connection portion memory layer is provided between the first connection portion conductive layer and the first portion. The second connection portion memory layer is provided between the second connection portion conductive layer and the second portion. The first pillar portion outer insulating film is provided between the first pillar portion memory layer and the plurality of first electrode films. The second pillar portion outer insulating film is provided between the second pillar portion memory layer and the plurality of second electrode films. The first connection portion outer insulating film is provided between the first connection portion conductive layer and the first portion. The second connection portion outer insulating film is provided between the second connection portion conductive layer and the second portion. The method includes forming a first insulating film serving as a part of the first connection portion outer insulating film, a part of the second connection portion outer insulating film, the first pillar portion outer insulating film, and the second pillar portion outer insulating film. The method includes oxidizing a semiconductor layer in contact with the part of the first connection portion outer insulating film and the part of the second connection portion outer insulating film to form the first connection portion outer insulating film and the second connection portion outer insulating film.

Embodiments will now be described with reference to the drawings.

The drawings are schematic or conceptual; and the relationships between the thickness and width of portions, the proportional coefficients of sizes among portions, etc. are not necessarily the same as the actual values thereof. Further, the dimensions and proportional coefficients may be illustrated differently among drawings, even for identical portions.

In the specification of the application and the drawings, components similar to those described in regard to a drawing thereinabove are marked with the same reference numerals, and a detailed description is omitted as appropriate.

First Embodiment

FIG. 1 is a schematic perspective view illustrating the configuration of a nonvolatile semiconductor memory device according to a first embodiment.

For easier viewing of the drawing, FIG. 1 illustrates only conductive portions and omits insulating portions.

Figure 2:
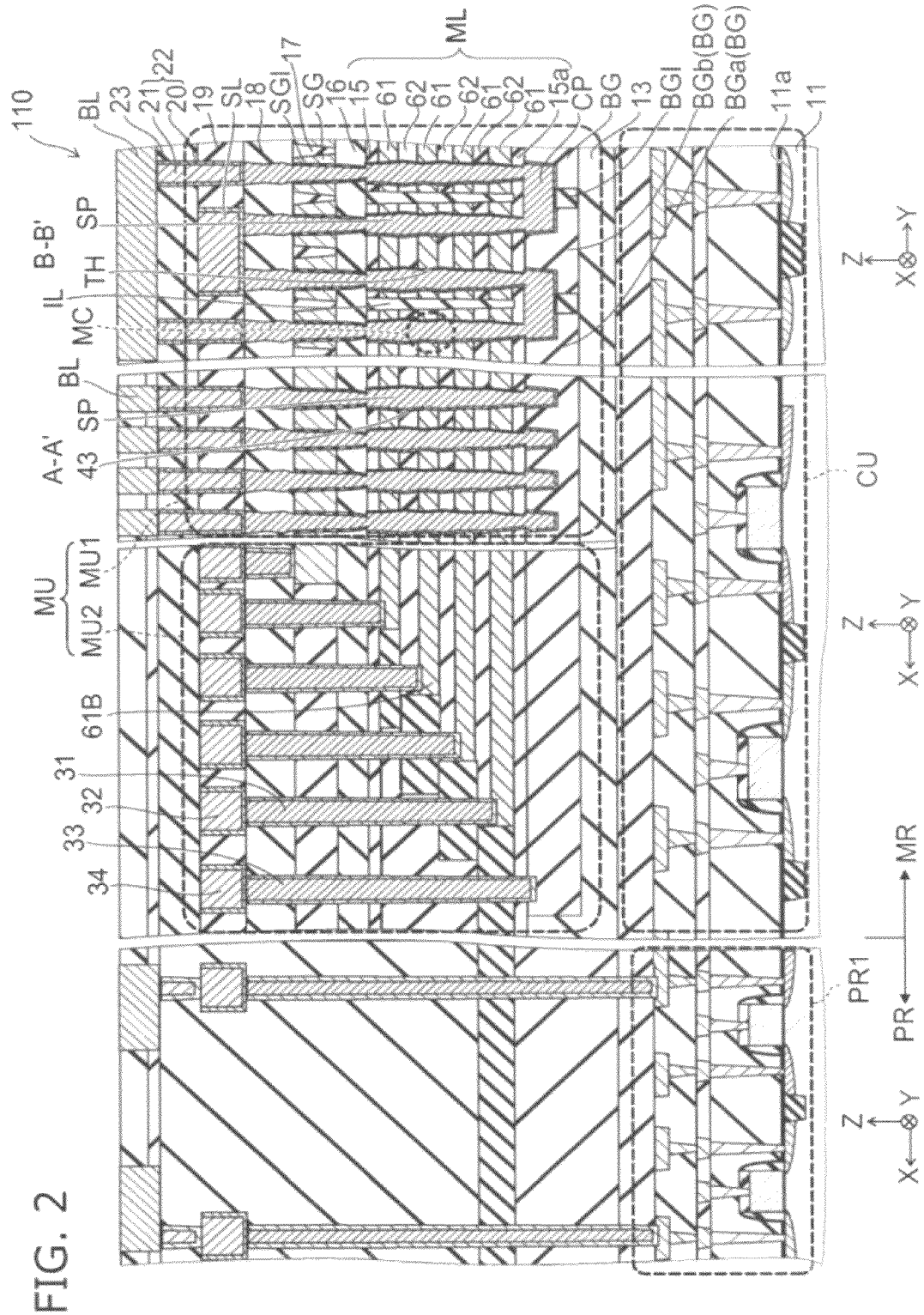
FIG. 2 is a schematic cross-sectional view illustrating the whole configuration of the nonvolatile semiconductor memory device according to the first embodiment.

FIG. 2 is a schematic cross-sectional view illustrating the configuration of the whole nonvolatile semiconductor memory device according to the first embodiment.

Figure 3:
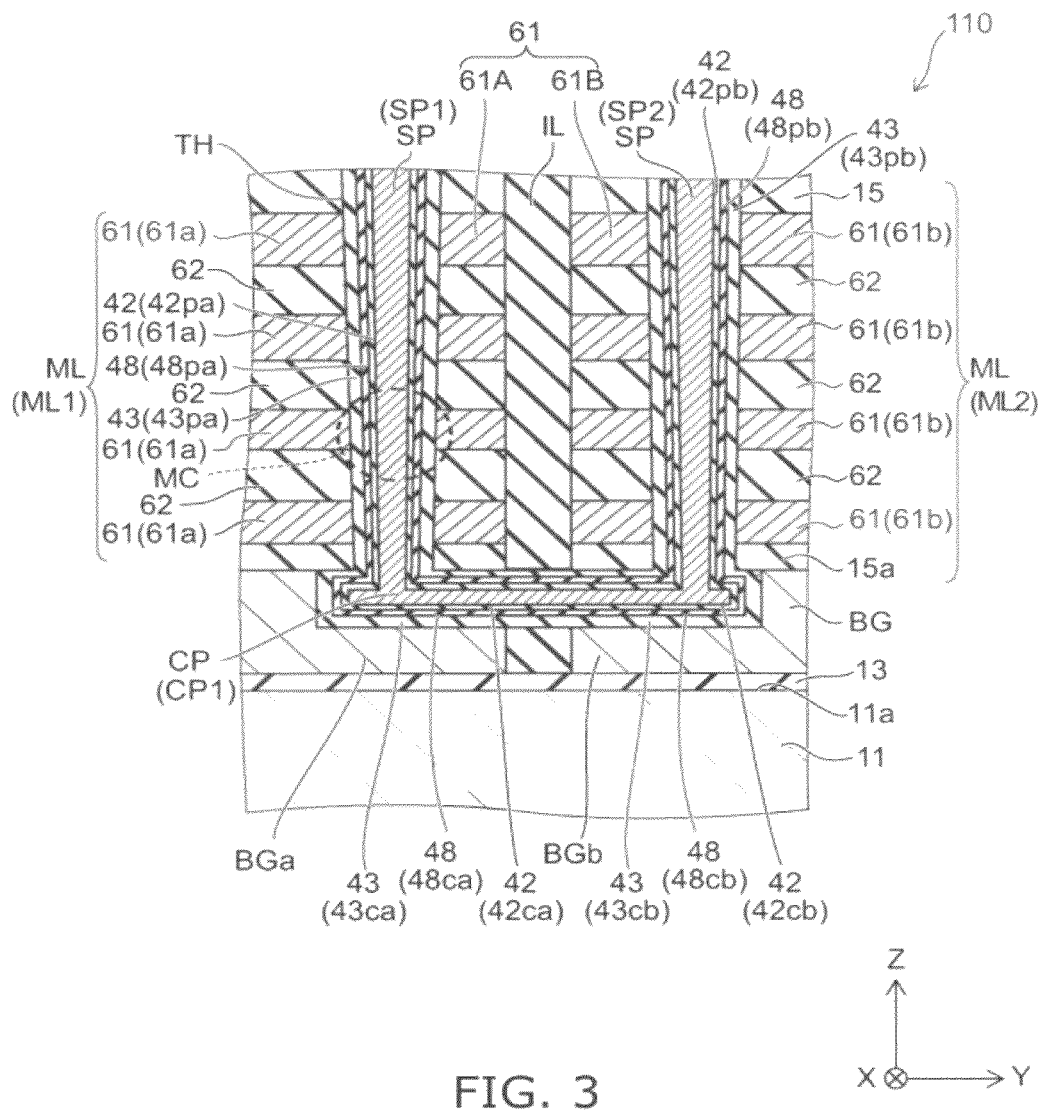
FIG. 3 is a schematic cross-sectional view illustrating the configuration of a part of the nonvolatile semiconductor memory device according to the first embodiment.

FIG. 3 is a schematic cross-sectional view illustrating the configuration of a part of the nonvolatile semiconductor memory device according to the first embodiment.

Figure 4:
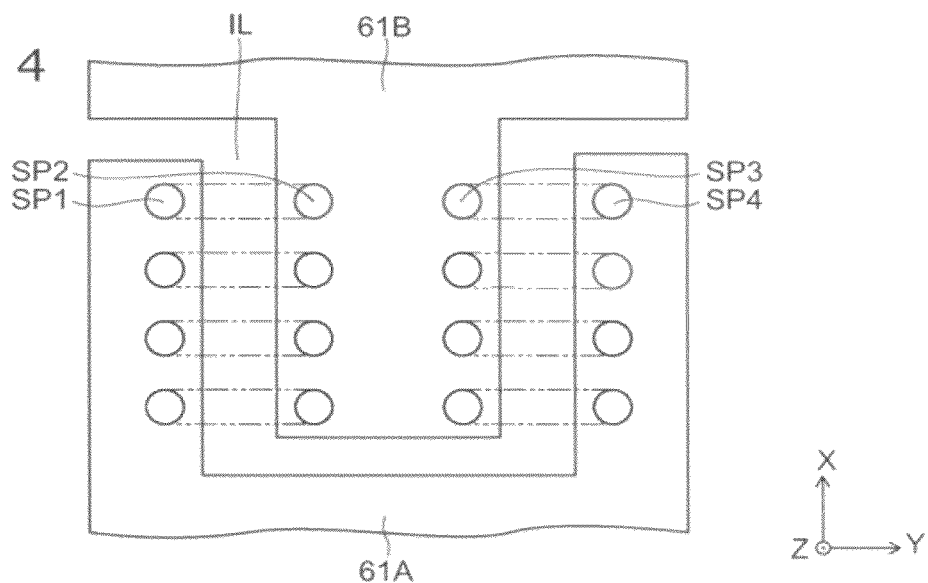
FIG. 4 is a schematic plan view illustrating the configuration of electrode films of the nonvolatile semiconductor memory device according to the first embodiment.

FIG. 4 is a schematic plan view illustrating the configuration of electrode films of the nonvolatile semiconductor memory device according to the first embodiment.

Figure 5:
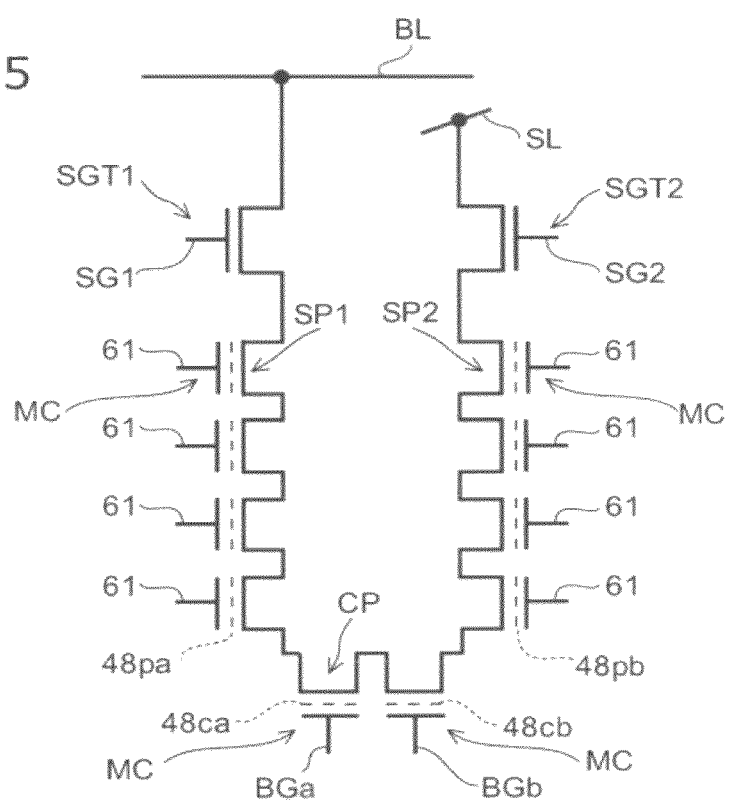
FIG. 5 is an equivalent circuit diagram illustrating the configuration of the nonvolatile semiconductor memory device according to the first embodiment.

FIG. 5 is an equivalent circuit diagram illustrating the configuration of the nonvolatile semiconductor memory device according to the first embodiment.

A nonvolatile semiconductor memory device 110 according to this embodiment is a three-dimensionally stacked flash memory.

As illustrated in FIG. 1 and FIG. 2, the nonvolatile semiconductor memory device 110 includes a semiconductor substrate 11 (substrate) made of, for example, single crystal silicon.

In the semiconductor substrate 11 in this specific example, a memory array region MR in which memory cells are formed and a periphery region PR provided, for example, around the memory array region MR are set. In the periphery region PR, various periphery region circuits PR1 are provided on the semiconductor substrate 11.

In the memory array region MR, a circuit unit CU, for example, is provided on the semiconductor substrate 11 and a memory unit MU is provided on the circuit unit CU. The circuit unit CU is provided as necessary and may be omitted. An interlayer insulating film 13 made of, for example, silicon oxide is provided between the circuit unit CU and the memory unit MU.

The memory unit MU includes, for example, a matrix memory cell unit MU1 including memory cell transistors arranged in a three-dimensional matrix form and an interconnection connecting unit MU2 connecting the interconnections of the matrix memory cell unit MU1.

FIG. 1 illustrates the configuration of the matrix memory cell unit MU1.

FIG. 2 illustrates a part of the cross section along line A-A' of FIG. 1 and a part of the cross section along line B-B' of FIG. 1 as the matrix memory cell unit MU1.

As illustrated in FIG. 1 and FIG. 2, in the matrix memory cell unit MU1, a stacked structure body ML is provided on a major surface 11a of the semiconductor substrate 11.

The stacked structure body ML includes a plurality of electrode films 61 and a plurality of inter-electrode insulating films 62 alternately stacked in a first direction. The inter-electrode insulating film 62 functions as an interlayer insulating film insulating the electrode films 61 from each other.

In the specification of the application, the "stack" includes not only being stacked directly but also being stacked via other components.

The stacking direction of the electrode films 61 and the inter-electrode insulating films 62 in the stacked structure body ML is taken as a Z-axis direction (first direction). In this specific example, the Z-axis direction is the direction perpendicular to the major surface 11a of the semiconductor substrate 11. One direction perpendicular to the Z-axis direction is taken as a Y-axis direction (second direction). The direction perpendicular to the Z-axis direction and the Y-axis direction is taken as an X-axis direction (third direction).

The nonvolatile semiconductor memory device 110 further includes select gate electrodes SG. The select gate electrodes SG are stacked with the stacked structure body ML along the Z-axis direction.

In this specific example, the electrode film 61 includes a strip-shaped portion extending along the X-axis direction. Also the select gate electrode SG includes a strip-shaped portion extending along the X-axis direction.

Further, semiconductor pillars SP piercing the stacked structure body ML and the select gate electrodes SG in the Z-axis direction are provided. The semiconductor pillar SP is formed by, for example, burying a semiconductor in a through hole TH piercing the stacked structure body ML in the Z-axis direction.

As described later, in the nonvolatile semiconductor memory device 110, a memory cell transistor including a memory layer is formed at the intersection of the electrode film 61 and the semiconductor pillar SP. The memory cell transistors are arranged in a three-dimensional matrix form, and each memory cell transistor functions as a memory cell MC that stores data by storing a charge in the memory layer.

Although FIG. 1 and FIG. 2 illustrate four electrode films 61, the number of electrode films 61 provided in the stacked structure body ML is arbitrary.

In the semiconductor pillar SP, a portion piercing the stacked structure body ML and a portion piercing the select gate electrode SG may be a continuously formed semiconductor layer, or a portion of the semiconductor pillar SP piercing the stacked structure body ML and a portion of the semiconductor pillar SP piercing the select gate electrode SG may be formed in different processes and be electrically connected.

The semiconductor pillar SP may have a round columnar shape extending in the Z-axis direction, or a cylinder shape extending in the Z-axis direction. In the case where the semiconductor pillar SP has a cylinder shape extending in the Z-axis direction, an insulating film, for example, may be buried in the cylinder.

As illustrated in FIG. 2, an insulating film 15a may be provided below the lowermost electrode film 61 (for example, on the side nearest to the semiconductor substrate 11) of the stacked structure body ML. Also the insulating film 15a may be included in the stacked structure body ML. Furthermore, an insulating film 15 may be provided on the uppermost electrode film 61 (for example, on the side farthest from the semiconductor substrate 11) of the stacked structure body ML. Also the insulating film 15 may be included in the stacked structure body ML. Silicon oxide, for example, may be used for the insulating films 15 and 15a. However, the embodiment is not limited thereto, but the materials of the insulating films 15 and 15a are arbitrary.

Furthermore, an interlayer insulating film 16 may be provided between the stacked structure body ML and the select gate electrode SG.

As illustrated in FIG. 2, an interlayer insulating film 17 dividing the select gate electrode SG along the Y-axis direction is provided. The interlayer insulating film 17 extends along the X-axis direction.

An interlayer insulating film 18 is provided on the interlayer insulating film 17, and a source line SL (second interconnection) and a via 22 are provided thereon. An interlayer insulating film 19 is provided around the source line SL. The via 22 includes, for example, a stacked film of a barrier layer 20 and a metal layer 21.

An interlayer insulating film 23 is provided on the source line SL, and a bit line BL (first interconnection) is provided thereon. The bit line BL has a strip shape along the Y-axis, for example. Silicon oxide, for example, may be used for the interlayer insulating films 16, 17, 18, 19, and 23.

In this specific example, two semiconductor pillars SP are connected on the semiconductor substrate 11 side.

That is, the nonvolatile semiconductor memory device 110 further includes a semiconductor connection portion CP (first semiconductor connection portion CP1) that electrically connects the first semiconductor pillar SP1 and the second semiconductor pillar SP2 on the semiconductor substrate 11 side. A material that forms the semiconductor pillar SP may be used for the semiconductor connection portion CP.

As illustrated in FIG. 2, the side of one end of the semiconductor connection portion CP is opposed to a first connection portion conductive layer BGa, and the side of the other end of the semiconductor connection portion CP is opposed to a second connection portion conductive layer BGb. That is, a connection portion conductive layer BG (back gate) is divided along the Y-axis direction by a connection portion insulating layer BGI; the first connection portion conductive layer BGa out of the connection portion conductive layers BG is opposed to a part on the side of the one end of the semiconductor connection portion CP, and the second connection portion conductive layer BGb out of the connection portion conductive layers BG is opposed to a part on the side of the other end of the semiconductor connection portion CP.

Thus, the semiconductor pillar is provided in plural in the nonvolatile semiconductor memory device 110. "Semiconductor pillar SP" is used to refer to all of the semiconductor pillars or any semiconductor pillar; and "n-th semiconductor pillar SPn" (n being any integer not less than 1) is used to refer to a specific semiconductor pillar in such cases as describing the relationship between specific semiconductor pillars. Similarly, in regard to other components, for example, "semiconductor connection portion CP" is used to refer to all of the semiconductor connection portions or any semiconductor connection portion; and "n-th semiconductor connection portion CPn" (n being any integer not less than 1) is used to refer to a specific semiconductor connection portion.

As illustrated in FIG. 1, the first and second semiconductor pillars SP1 and SP2 connected by the first semiconductor connection portion CP1 constitute a pair to form one U-shaped NAND string, and the third and fourth semiconductor pillars SP3 and SP4 connected by the second semiconductor connection portion CP2 constitute a pair to form another U-shaped NAND string.

As illustrated in FIG. 4, for example, in regard to the electrode film 61, the electrode films corresponding to the semiconductor pillars SP(4m+1) and SP(4m+4) are commonly connected to form an electrode film 61A, where m is an integer not less than 0 and n is (4m+1) and (4m+4); and the electrode films corresponding to the semiconductor pillars SP(4m+2) and SP(4m+3) are commonly connected to form an electrode film 61B, where n is (4m+2) and (4m+3). In other words, the electrode film 61 has a form in which the electrode film 61A and the electrode film 61B are combined with each other in a comb teeth configuration opposing in the X-axis direction.

As illustrated in FIG. 3, the electrode film 61A and the electrode film 61B are divided from each other by an insulating layer IL.

As illustrated in the interconnection connecting unit MU2 illustrated in FIG. 2, the electrode film 61B is connected to a word interconnection 32 by a via plug 31 at one end in the X-axis direction to be electrically connected to, for example, a driving circuit provided in the semiconductor substrate 11. Similarly, the electrode film 61A is connected to the word interconnection by a via plug at the other end in the X-axis direction to be electrically connected to the driving circuit (not illustrated in FIG. 2). In other words, the length in the X-axis direction of each of the electrode films 61 (the electrode films 61A and the electrode films 61B) stacked in the Z-axis direction changes in a stairstep configuration; the electrode film 61A is electrically connected to the driving circuit at one end in the X-axis direction; and the electrode film 61B is electrically connected to the driving circuit at the other end in the X-axis direction. Although the via plug 31 is connected to each of the electrode films 61 at the same position in the Y-axis direction in FIG. 2, the via plugs 31 corresponding to the electrode films 61 may be provided at different positions in the Y-axis direction.

Thereby, in the electrode film 61 at a certain distance from the semiconductor substrate 11, the electric potential can be set different between the first semiconductor pillar SP1 and the second semiconductor pillar SP2 which constitute a pair. Thereby, the memory cells MC in this layer corresponding to the first semiconductor pillar SP1 and the second semiconductor pillar SP2 can operate independently from each other. This applies also to the third semiconductor pillar SP3 and the fourth semiconductor pillar SP4.

A combination of the electrode film 61A and the electrode film 61B may form one erasing block, and an electrode film 61A and an electrode film 61B are divided from another electrode film 61A and another electrode film 61B for each erasing block.

The numbers of semiconductor pillars in the X-axis direction and in the Y-axis direction included in each erasing block are arbitrary.

The connection portion conductive layer BG (back gate) is connected to a back gate interconnection 34 by a via plug 33, for example. That is, the first connection portion conductive layer BGa and the second connection portion conductive layer BGb are connected to different back gate interconnections (not illustrated) by different via plugs (not illustrated).

As illustrated in FIG. 1 and FIG. 2, each end of the semiconductor pillar SP on the side opposite to the semiconductor connection portion CP is connected to the bit line BL or the source line SL, and the select gate electrode SG (the first to fourth select gate electrodes SG1 to SG4) is provided for each of the semiconductor pillars SP. Thereby, desired data can be written on or read out from an arbitrary memory cell MC of an arbitrary semiconductor pillar SP.

FIG. 3 illustrates the configuration of the matrix memory cell unit MU1, and is, for example, a cross-sectional view corresponding to a part of the cross section along line B-B' of FIG. 1.

As illustrated in FIG. 3, the nonvolatile semiconductor memory device 110 includes the semiconductor pillar SP mentioned above, a memory layer 48, an inner insulating film 42, and an outer insulating film 43.

The memory layer 48 is provided between each of the electrode films 61 and the semiconductor pillar SP. The memory layer 48 is further provided between the first connection portion conductive layer BGa and the semiconductor connection portion CP and between the second connection portion conductive layer BGb and the semiconductor connection portion CP, in the portion of the semiconductor connection portion CP.

The inner insulating film 42 is provided between the memory layer 48 and the semiconductor pillar SP. The inner insulating film 42 is further provided between the memory layer 48 and the semiconductor connection portion CP, in the portion of the semiconductor connection portion CP. The inner insulating film 42 functions as a tunneling insulating film.

The outer insulating film 43 is provided between the memory layer 48 and the electrode film 61. The outer insulating film 43 is further provided between the memory layer 48 and the first connection portion conductive layer BGa and between the memory layer 48 and the second connection portion conductive layer BGb, in the portion of the semiconductor connection portion CP. The outer insulating film 43 functions as a block insulating film.

A stacked film of the outer insulating film 43, the memory layer 48, and the inner insulating film 42 is referred to as a three-layer stacked film 47 for the sake of convenience.

A prescribed electric signal is applied to the electrode film 61, and the electric film 61 can function as a word electrode of the nonvolatile semiconductor memory device 110.

Furthermore, a prescribed electric signal is applied also to the first connection portion conductive layer BGa and the second connection portion conductive layer BGb, and also the first connection portion conductive layer BGa and the second connection portion conductive layer BGb can function as other word lines of the nonvolatile semiconductor memory device 110. That is, the first connection portion conductive layer BGa and the second connection portion conductive layer BGb are divided by the connection portion insulating layer BGI, and thereby the electric potential of the first connection portion conductive layer BGa can be set independently from the electric potential of the second connection portion conductive layer BGb.

Any conductive material may be used for the electrode film 61, the select gate electrode SG, the first connection portion conductive layer BGa, and the second connection portion conductive layer BGb. For example, amorphous silicon (non-crystalline silicon) provided with electrical conductivity by introducing an impurity, polysilicon (polycrystalline silicon) provided with electrical conductivity by introducing an impurity, or the like may be used, and also a metal, an alloy, or the like may be used.

Silicon oxide, for example, may be used for the inter-electrode insulating film 62, the inner insulating film 42, and the outer insulating film 43.

Silicon nitride, for example, may be used for the memory layer 48. The memory layer 48 stores or discharges a charge by an electric field applied between the semiconductor pillar SP and the electrode film 61 or an electric field applied between the semiconductor connection portion CP and the connection portion conductive portion BG, and functions as a portion that stores information. The memory layer 48 may be either a single layer film or a stacked film.

As described later, the inter-electrode insulating film 62, the inner insulating film 42, the outer insulating film 43, and the memory layer 48 may be made of an arbitrary material, not limited to the material illustrated above.

Thus, in the nonvolatile semiconductor memory device 110, a memory cell transistor including the memory layer 48 is formed at the intersection of the electrode film 61 and the semiconductor pillar SP. The memory cell transistors are arranged in a three-dimensional matrix form. Each memory cell transistor functions as the memory cell MC that stores data by storing a charge in the memory layer 48.

Furthermore, a memory cell transistor including the memory layer 48 is formed at the intersection of the first connection portion conductive layer BGa and the second connection portion conductive layer BGb, and the semiconductor connection portion CP. That is, two memory cells MC are further formed in the semiconductor connection portion CP connecting two semiconductor pillars SP. This further increases memory capacity.

As illustrated in FIG. 2, in the nonvolatile semiconductor memory device 110, a select gate insulating film SGI is provided between the select gate electrode SG and the semiconductor pillar SP.

For the select gate insulating film SGI, the stacked film of the inner insulating film 42, the memory layer 48, and the outer insulating film 43 mentioned above may be used, and also an insulating film different from the stacked film of the inner insulating film 42, the memory layer 48, and the outer insulating film 43 may be used. The select gate insulating film SGI may be either a single layer film or a stacked film.

A first select gate transistor SGT1 is formed at the intersection of the select gate electrode SG and the first semiconductor pillar SP1, and a second select gate transistor SGT2 is formed at the intersection of the select gate electrode SG and the second semiconductor pillar SP2. The select gate insulating film SGI functions as a gate insulating film of these select gate transistors. These select gate transistors function to select the semiconductor pillar SP.

Thus, the nonvolatile semiconductor memory device 110 includes a first stacked structure body ML1 and a second stacked structure body ML2.

The first stacked structure body ML1 includes a plurality of first electrode films 61a and a plurality of first inter-electrode insulating films 62a alternately stacked in the Z-axis direction.

The second stacked structure body ML2 is adjacent to the first stacked structure body ML1 in the Y-axis direction perpendicular to the Z-axis direction. The second stacked structure body ML2 includes a plurality of second electrode films 61b and a plurality of second inter-electrode insulating films 62b alternately stacked in the Z-axis direction.

Each of the plurality of first electrode films 61a and each of the plurality of second electrode films 61b are the same layer. That is, the distance between the semiconductor substrate 11 and each of the plurality of first electrode films 61a is equal to the distance between the semiconductor substrate 11 and each of the plurality of second electrode films 61b. The distance between the semiconductor substrate 11 and each of the plurality of first inter-electrode insulating films 62a is equal to the distance between the semiconductor substrate 11 and each of the plurality of second inter-electrode insulating films 62b.

The nonvolatile semiconductor memory device 110 further includes the first semiconductor pillar SP1, the second semiconductor pillar SP2, the semiconductor connection portion CP (the first semiconductor connection portion CP1), the first connection portion conductive layer BGa, the second connection portion conductive layer BGb, a first pillar portion memory layer 48pa, a second pillar portion memory layer 48pb, a first connection portion memory layer 48ca, and a second connection portion memory layer 48cb.

The first semiconductor pillar SP1 pierces the first stacked structure body ML1 in the Z-axis direction. The second semiconductor pillar SP2 pierces the second stacked structure body ML2 in the Z-axis direction. The second semiconductor pillar SP2 is adjacent to the first semiconductor pillar SP1 along the Y-axis direction. The semiconductor connection portion CP (the first semiconductor connection portion CP1) connects one end of the first semiconductor pillar SP1 and one end of the second semiconductor pillar SP2.

The first connection portion conductive layer BGa is opposed to a portion (first portion) of the semiconductor connection portion CP on the first semiconductor pillar SP1 side. The second connection portion conductive layer BGb is opposed to a portion (second portion) of the semiconductor connection portion CP on the second semiconductor pillar SP2 side.

The first pillar portion memory layer 48pa is provided between the plurality of first electrode films 61a and the first semiconductor pillar SP1. The second pillar portion memory layer 48pb is provided between the plurality of second electrode films 61b and the second semiconductor pillar SP2. The first connection portion memory layer 48ca is provided between the first connection portion conductive layer BGa and the semiconductor connection portion CP (the first portion mentioned above). The second connection portion memory layer 48cb is provided between the second connection portion conductive layer BGb and the semiconductor connection portion CP (the second portion mentioned above).

The first pillar portion memory layer 48pa, the second pillar portion memory layer 48pb, the first connection portion memory layer 48ca, and the second connection portion memory layer 48cb may be formed simultaneously with each other as a one-body film (the memory layer 48).

The plurality of first electrode films 61a and the plurality of second electrode films 61b may include a portion extending along the X-axis direction perpendicular to the Z-axis direction and the Y-axis direction. Furthermore, also the first connection portion conductive layer BGa and the second connection portion conductive layer BGb may include a portion extending along the X-axis direction perpendicular to the Z-axis direction and the Y-axis direction.

As illustrated in FIG. 5, in the nonvolatile semiconductor memory device 110 having such a configuration, the memory cells MC are formed in the portion of the semiconductor pillar SP, and further, two memory cells MC are formed also in the portion of the semiconductor connection portion CP. This enables to further increase memory capacity.

As described above in regard to FIG. 3, the nonvolatile semiconductor memory device 110 may further include the inner insulating film 42 provided between the memory layer 48, and the semiconductor pillar SP and the semiconductor connection portion CP.

That is, as illustrated in FIG. 3, the nonvolatile semiconductor memory device 110 may further include a first pillar portion inner insulating film 42pa provided between the first pillar portion memory layer 48pa and the first semiconductor pillar SP1, a second pillar portion inner insulating film 42pb provided between the second pillar portion memory layer 48pb and the second semiconductor pillar SP2, a first connection portion inner insulating film 42ca provided between the first connection portion memory layer 48ca and the first portion (the portion of the semiconductor connection portion CP on the first semiconductor pillar SP1 side), and a second connection portion inner insulating film 42cb provided between the second connection portion memory layer 48cb and the second portion (the portion of the semiconductor connection portion CP on the second semiconductor pillar SP2 side).

The first pillar portion inner insulating film 42pa, the second pillar portion inner insulating film 42pb, the first connection portion inner insulating film 42ca, and the second connection portion inner insulating film 42cb are parts of the inner insulating film 42. The first pillar portion inner insulating film 42pa, the second pillar portion inner insulating film 42pb, the first connection portion inner insulating film 42ca, and the second connection portion inner insulating film 42cb may be formed as one body. The same material may be used for the first pillar portion inner insulating film 42pa, the second pillar portion inner insulating film 42pb, the first connection portion inner insulating film 42ca, and the second connection portion inner insulating film 42cb.

The nonvolatile semiconductor memory device 110 may further include the outer insulating film 43 provided between the memory layer 48, and the electrode film 61 and the connection portion conductive layer BG.

That is, as illustrated in FIG. 3, the nonvolatile semiconductor memory device 110 may further include a first pillar portion outer insulating film 43pa provided between the first pillar portion memory layer 48pa and the plurality of first electrode films 61, a second pillar portion outer insulating film 43pb provided between the second pillar portion memory layer 48pb and the plurality of second electrode films 61b, a first connection portion outer insulating film 43ca provided between the first connection portion memory layer 48ca and the first connection portion conductive layer BGa, and a second connection portion outer insulating film 43cb provided between the second connection potion memory layer 48cb and the second connection portion conductive layer BGb.

Moreover, the nonvolatile semiconductor memory device 110 may further include the first select gate electrode SG1 stacked with the first stacked structure body ML1 along the Z-axis direction and pierced by the first semiconductor pillar SP1, a first select gate insulating film (the select gate insulating film SGI) provided between the first select gate electrode SG1 and the first semiconductor pillar SP1, the second select gate electrode SG2 stacked with the second stacked structure body ML2 along the Z-axis direction and pierced by the second semiconductor pillar SP2, and a second select gate insulating film (the select gate insulating film SGI) provided between the second select gate electrode SG2 and the second semiconductor pillar SP2.

The first select gate electrode SG1 and the second select gate electrode SG2 may include a portion extending along the X-axis direction perpendicular to the Z-axis direction and the Y-axis direction. That is, the first select gate electrode SG1 and the second select gate electrode SG2 may extend along a direction parallel to the direction in which the first electrode film 61a and the second electrode film 61b extend.

As illustrated in FIG. 1 and FIG. 5, the nonvolatile semiconductor memory device 110 may further include the first interconnection (e.g. the bit line BL) and the second interconnection (e.g. the source line SL). The first interconnection is connected to another end of the first semiconductor pillar SP1 on the side opposite to the first semiconductor connection portion CP1. The second interconnection is connected to another end of the second semiconductor pillar SP2 on the side opposite to the first semiconductor connection portion CP1. The second interconnection extends in a direction orthogonal to the direction in which the first interconnection extends. In this specific example, the first interconnection extends along the Y-axis direction and the second interconnection extends along the X-axis direction.

As illustrated in FIG. 1, the first semiconductor pillar SP1 is connected to the bit line BL by a via V1 and the fourth semiconductor pillar SP4 is connected to the bit line BL by a via V2.

Hereinafter, the first stacked structure body ML1 and the second stacked structure body ML2 are collectively referred to as the stacked structure body ML. Furthermore, the first electrode film 61a and the second electrode film 61b are collectively referred to as the electrode film 61. Furthermore, the first inter-electrode insulating film 62a and the second inter-electrode insulating film 62b are collectively referred to as the inter-electrode insulating film 62. Moreover, the first select gate electrode SG1 and the second select gate electrode SG2 are collectively referred to as the select gate electrode SG.

As described above, the nonvolatile semiconductor memory device 110 may further include the third semiconductor pillar SP3, the fourth semiconductor pillar SP4, and the second semiconductor connection portion CP2.

The third semiconductor pillar SP3 is adjacent to the second semiconductor pillar SP2 on the opposite side of the second semiconductor pillar SP2 from the first semiconductor pillar SP1 in the Y-axis direction. The fourth semiconductor pillar SP4 is adjacent to the third semiconductor pillar SP3 on the opposite side of the third semiconductor pillar SP3 from the second semiconductor pillar SP2 in the Y-axis direction.

As described in regard to FIG. 4, in this specific example, the electrode film 61 pierced by the third semiconductor pillar SP3 is continuous with the second electrode film 61b pierced by the second semiconductor pillar SP2, and the electrode film 61 pierced by the fourth semiconductor pillar SP4 is continuous with the first electrode film 61a pierced by the first semiconductor pillar SP1. However, the embodiment is not limited thereto, but the semiconductor pillars SP may pierce different electrode films 61 (for example, divided along the Y-axis direction).

The second semiconductor connection portion CP2 connects one end of the third semiconductor pillar SP3 and one end of the fourth semiconductor pillar SP4. The first interconnection is further connected to, for example, another end of the fourth semiconductor pillar SP4 on the side opposite to the second semiconductor connection portion CP2. The second interconnection is further connected to another end of the third semiconductor pillar SP3 on the side opposite to the second semiconductor connection portion CP2.

FIG. 6A to FIG. 6C, FIG. 7A and FIG. 7B, FIG. 8A and FIG. 8B, and FIG. 9A and FIG. 9B are schematic cross-sectional views in order of the processes, illustrating a method for manufacturing a nonvolatile semiconductor memory device according to the first embodiment.

These drawings are cross-sectional views when the matrix memory cell unit MU1 is cut along the Y-Z plane and correspond to, for example, the cross-sectional view along line B-B' of FIG. 1. These drawings omit the circuit unit CU.

Figure 6A:
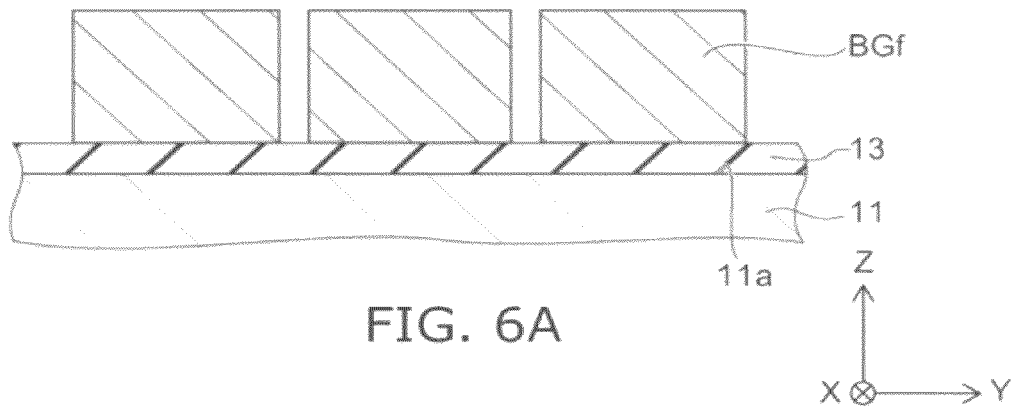
FIG. 6A to FIG. 6C, FIG. 7A and FIG. 7B, FIG. 8A and FIG. 8B, and FIG. 9A and FIG. 9B are schematic cross-sectional views in order of the processes, illustrating a method for manufacturing the nonvolatile semiconductor memory device according to the first embodiment.

As illustrated in FIG. 6A, for example, the interlayer insulating film 13 is formed on the major surface 11a of the semiconductor substrate 11, a connection portion conductive film BGf that forms the connection portion conductive layer BG is formed on the interlayer insulating film 13, and for example, trenches extending in the X-axis direction are formed to process the connection portion conductive film BGf into strip shapes extending in the X-axis direction. Polysilicon, for example, may be used for the connection portion conductive film BGf.

Figure 6B:
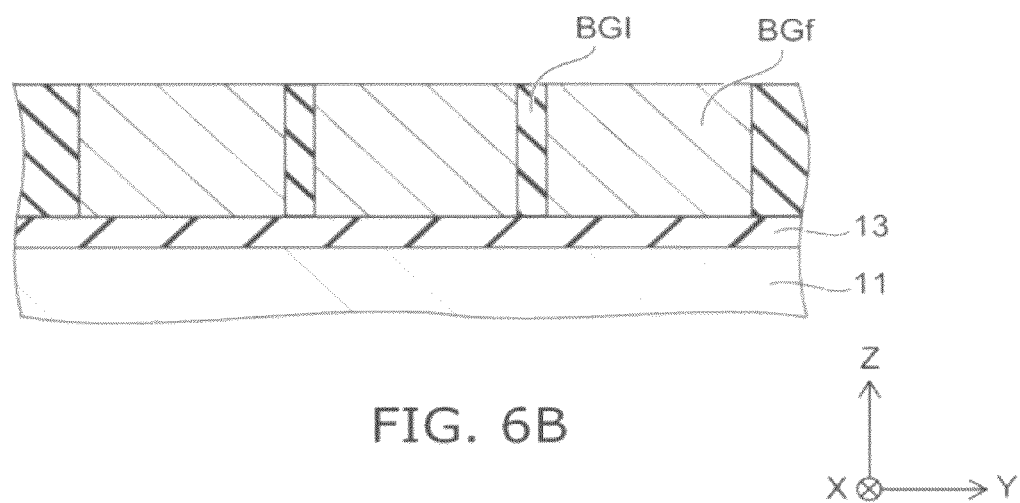

Next, as illustrated in FIG. 6B, an insulating material is buried in the trench between the connection portion conductive films BGf and the surface is planarized; thereby, the connection portion insulating layers BGI are formed. Silicon oxide, for example, may be used for the connection portion insulating layer BGI.

Figure 6C:
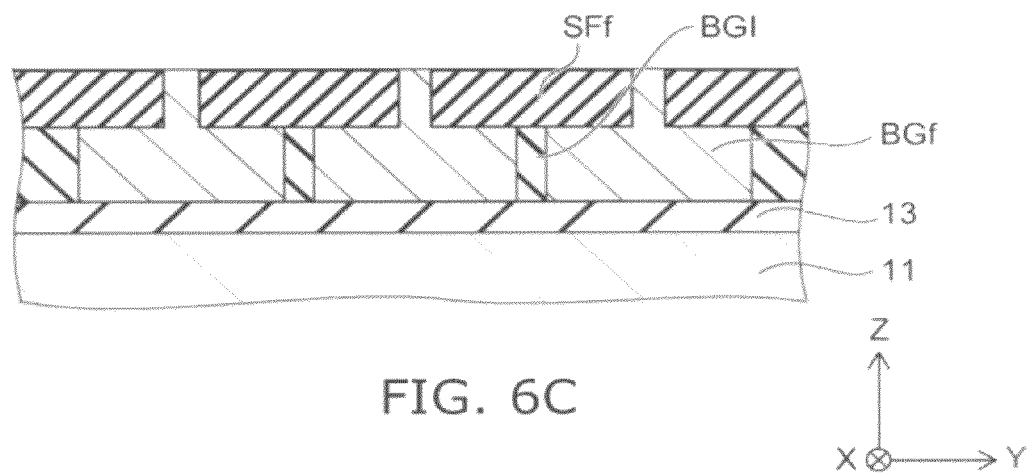

Next, as illustrated in FIG. 6C, trenches are formed in portions of the connection portion conductive film BGf which form the semiconductor connection portions CP and in the connection portion insulating layers BGI; a sacrifice film SFf is buried in the trench; and the surface is planarized. Silicon nitride, for example, may be used for the sacrifice film SFf.

Next, the insulating film 15a is formed on the connection portion conductive film BGf and the sacrifice films SFf, and a doped polysilicon film DPS doped with an impurity and a nondoped polysilicon film NPS doped with no impurity are alternately deposited thereon. In this specific example, the doped polysilicon film DPS is doped with, for example, boron. However, the impurity for doping is arbitrary. In this specific example, the doped polysilicon film DPS is processed into the electrode film 61.

Figure 7A:
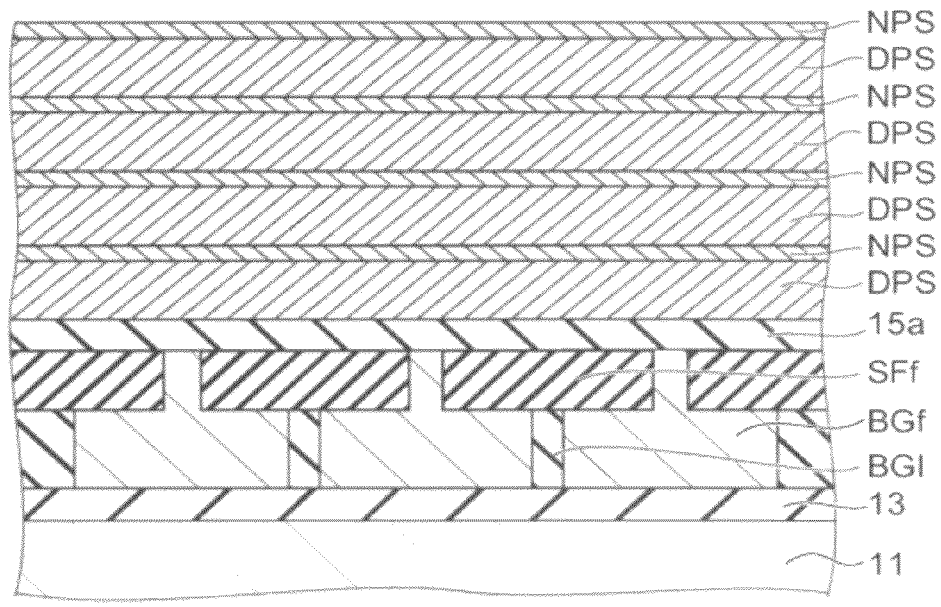
Figure 7B:
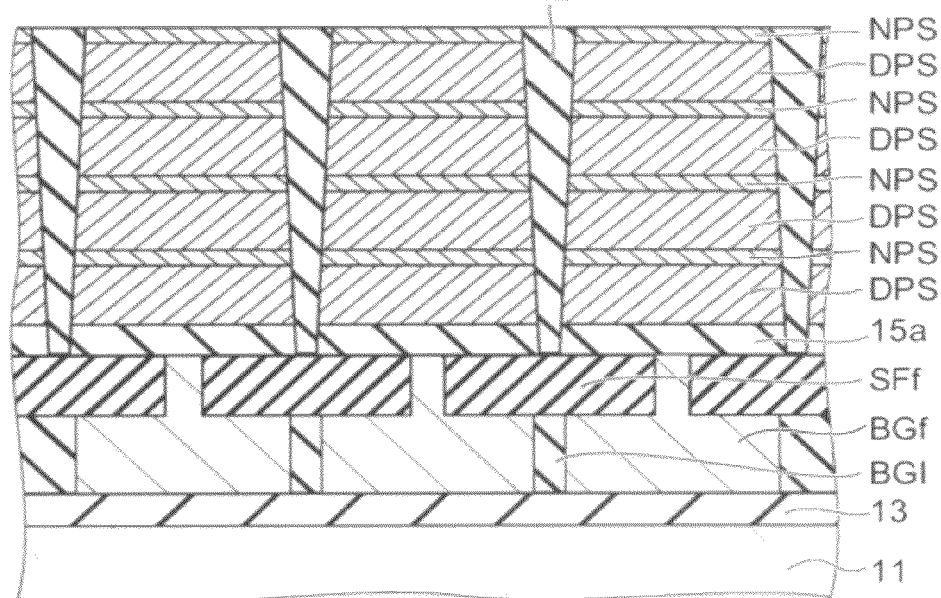

Next, as illustrated in FIG. 7B, slits reaching the sacrifice films SFf are formed in the doped polysilicon films DPS, the nondoped polysilicon films NPS, and the insulating film 15a. The slit extends along the X-axis direction, for example. Then, an insulating film is buried in the slit and the surface is planarized to form the insulating layer IL with a slit shape. The insulating layer IL forms an insulating portion that divides the electrode film 61. Silicon oxide may be used for the insulating layer IL, and the insulating layer IL is deposited by, for example, the atomic layer deposition (ALD) method. Thereby, the insulating layer IL extending in the X-axis direction is formed.

Figure 8A:
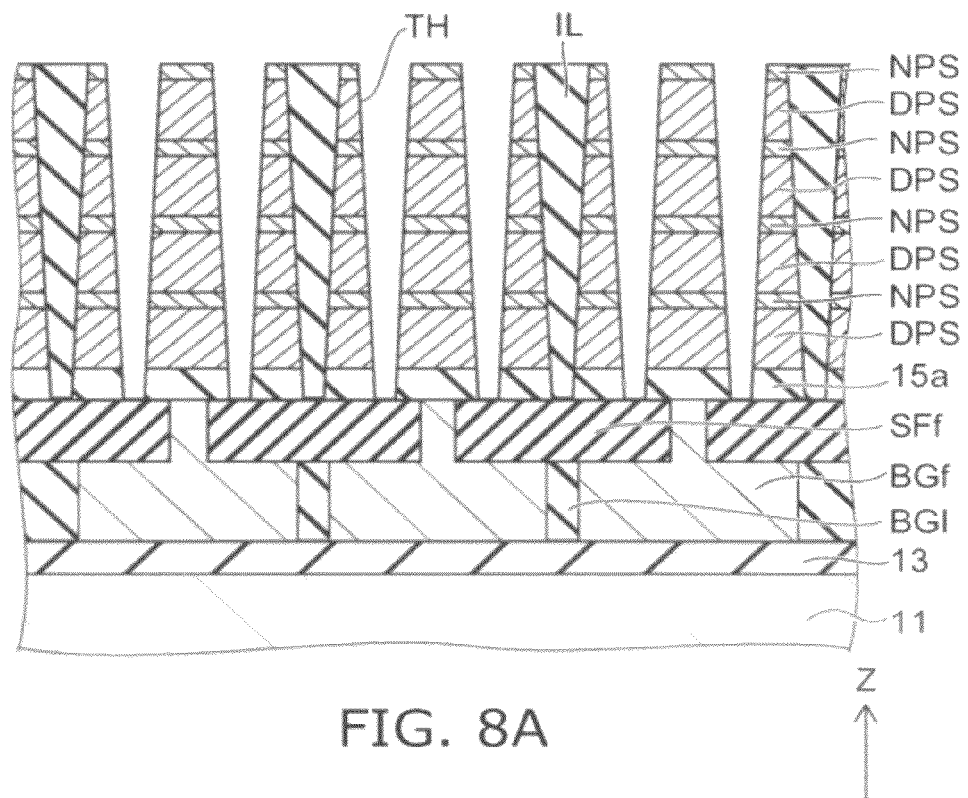

Next, as illustrated in FIG. 8A, the through holes TH reaching the sacrifice films SFf are formed in the doped polysilicon films DPS, the nondoped polysilicon films NPS, and the insulating film 15*a*.

Figure 8B:
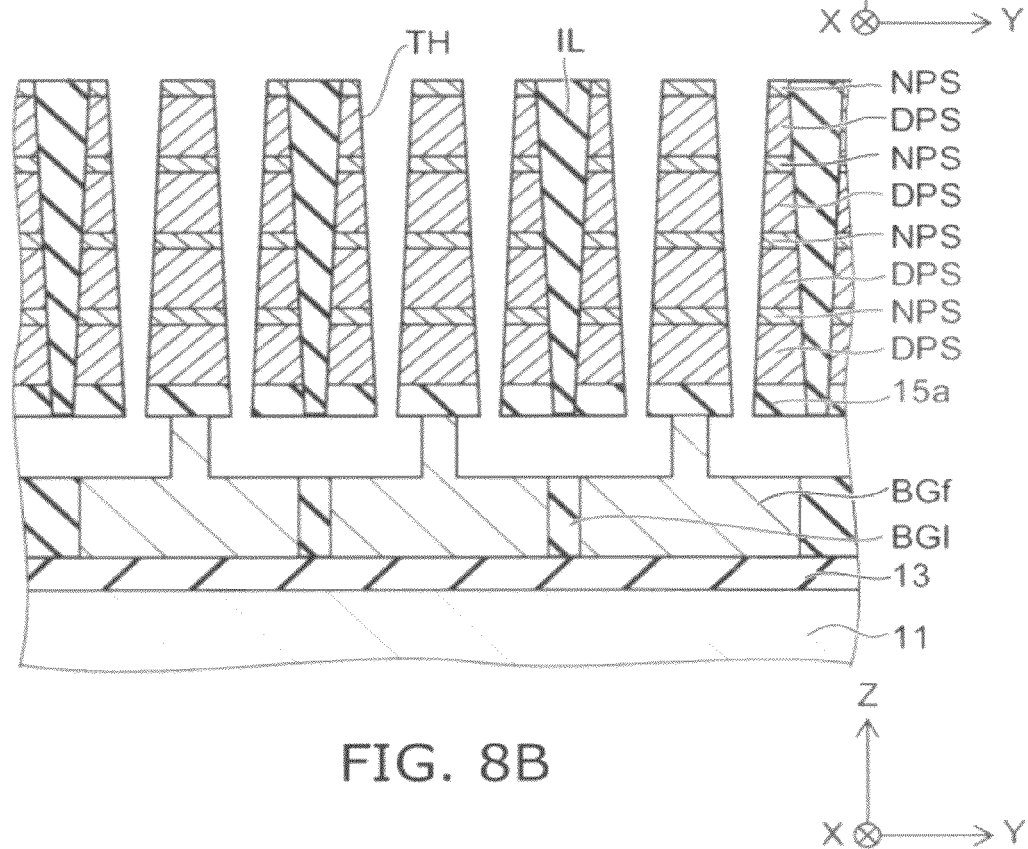

Next, as illustrated in FIG. 8B, the sacrifice films SFf are removed via the through holes TH.

Figure 9A:
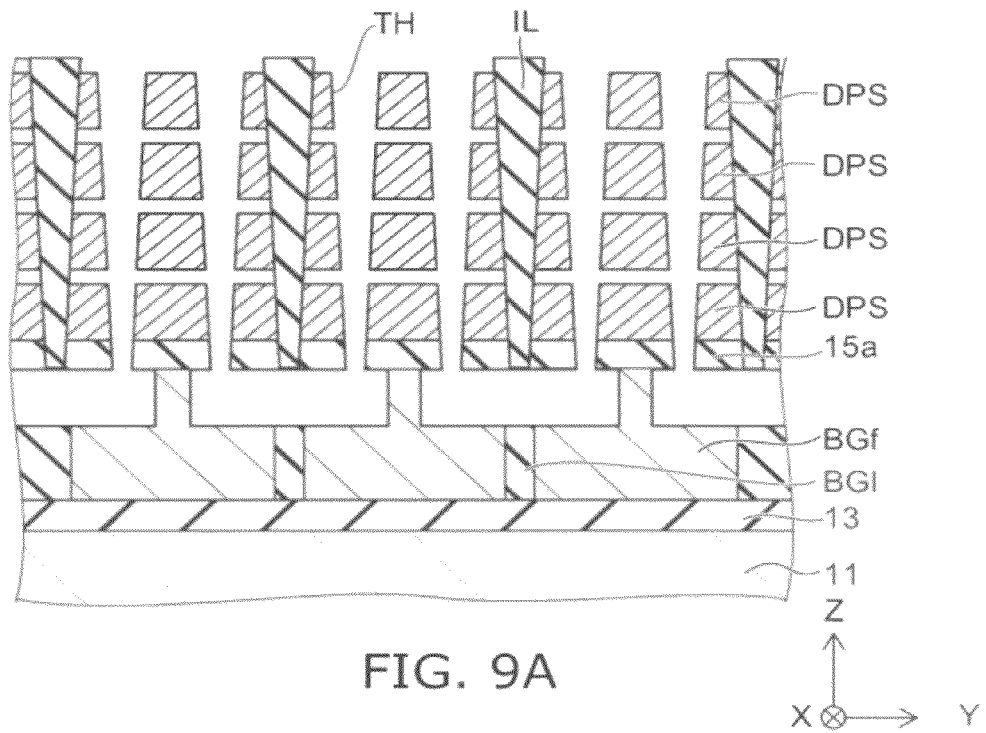

Next, as illustrated in FIG. 9A, the nondoped polysilicon films NPS are exposed to an alkali-based aqueous solution via the through hole TH to remove the nondoped polysilicon films NPS. At this time, the insulating layer IL supports the doped polysilicon films DPS (the electrode films 61) to prevent the stacking structure of the doped polysilicon films DPS (the electrode films 61) from collapsing.

Figure 9B:
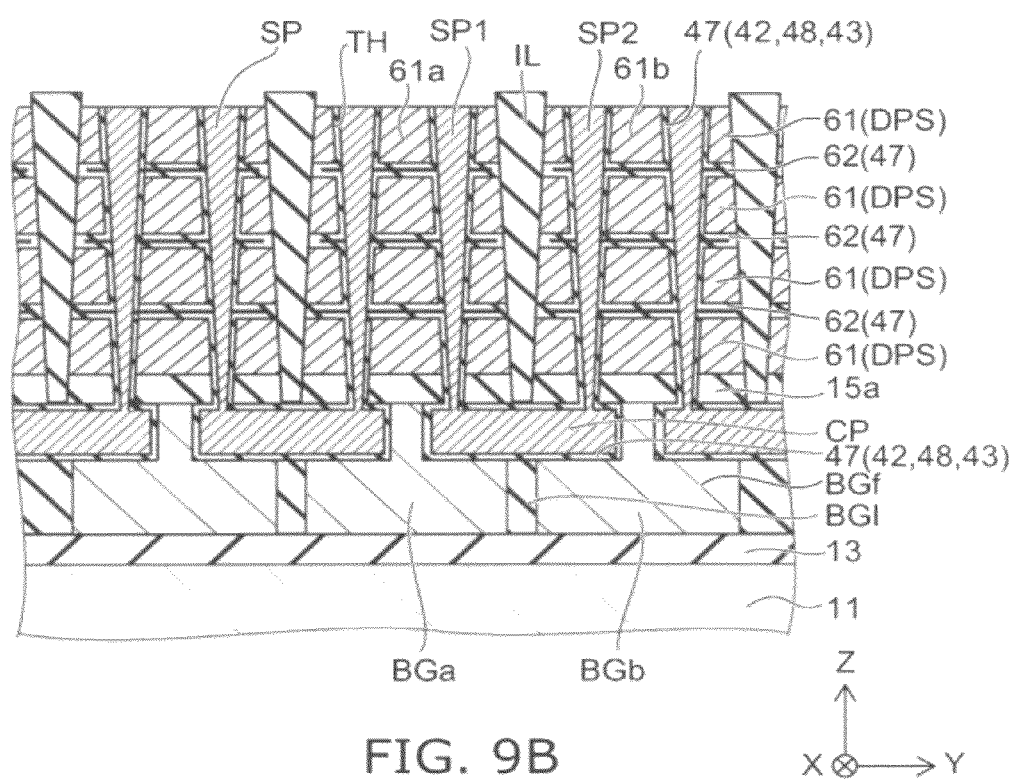

Next, as illustrated in FIG. 9B, the outer insulating film 43, the memory layer 48, and the inner insulating film 42 are successively deposited on the inner wall face of the through hole TH, on the inner wall face of the trench where the sacrifice film SFf has been removed, and in the gap between the doped polysilicon films DPS (the electrode films 61) to form the three-layer stacked film 47. At this time, for example, the gap between the doped polysilicon films DPS (the electrode films 61) is set narrower than the inner diameter of the through hole TH and the size of the trench where the sacrifice film SFf has been removed. Thereby, the gap between the doped polysilicon films DPS (the electrode films 61) is filled with the three-layer stacked film 47, and the three-layer stacked film 47 in the gap between the doped polysilicon films DPS (the electrode films 61) forms the inter-electrode insulating film 62.

Thus, in this embodiment, the gap between the electrode films 61 (i.e., the thickness of the inter-electrode insulating film 62) may be set smaller than the inner diameter of the through hole TH. In this case, the thicknesses of the first inter-electrode insulating film 62*a* and the second inter-electrode insulating film 62*b* along the Z-axis direction are set smaller than the outer diameter of the first pillar portion outer insulating film 43*pa* and the outer diameter of the second pillar portion outer insulating film 43*pb*.

Then, amorphous silicon, for example, is buried and crystallized in the remaining space of the through hole TH and the remaining space of the trench where the sacrifice film SFf has been removed. Thereby, the amorphous silicon buried in the through hole TH forms the semiconductor pillar SP, and the amorphous silicon buried in the trench where the sacrifice film SFf has been removed forms the semiconductor connection portion CP. Thereby, the memory cells can be formed in the portion of the semiconductor pillar SP and the portion of the semiconductor connection portion CP. After that, the select gate electrodes SG, various interconnections, and various interlayer insulating films are formed, and the nonvolatile semiconductor memory device 110 can be thus formed.

In this embodiment, the connection portion conductive film BGf is divided by the connection portion insulating layer BGI extending in the X-axis direction to form the first connection portion conductive layer BGa and the second connection portion conductive layer BGb. Furthermore, the doped polysilicon film DPS (the electrode film 61) is divided by the insulating layer IL extending along the X-axis direction into strip shapes extending along the X-axis direction to form the first electrode film 61*a* and the second electrode film 61*b*.

In this specific example, the three-layer stacked film 47 was collectively formed on the inner wall face of the through hole TH, on the inner wall face of the trench where the sacrifice film SFf has been removed, and in the gap between the doped polysilicon films DPS (the electrode films 61). In this configuration, the inter-electrode insulating film 62 provided in the gap between the electrode films 61 includes the three-layer stacked film 47. In this case, the first inter-electrode insulating film 62*a* and the second inter-electrode insulating film 62*b* include a film made of the material used for the memory layer 48 (the first pillar portion memory layer 48*pa*, the second pillar portion memory layer 48*pb*, the first connection portion memory layer 48*ca*, and the second connection portion memory layer 48*cb*). Furthermore, the first inter-electrode insulating film 62*a* and the second inter-electrode insulating film 62*b* include a film made of the material used for the outer insulating film 43 (the first pillar portion outer insulating film 43*pa*, the second pillar portion outer insulating film 43*pb*, the first connection portion outer insulating film 43*ca*, and the second connection portion outer insulating film 43*cb*).

However, the embodiment is not limited thereto but may use the following method, for example. That is, silicon oxide is formed on the inner wall face of the through hole TH, on the inner wall face of the trench where the sacrifice film SFf has been removed, and in the gap between the doped polysilicon films DPS (the electrode films 61) by, for example, the ALD method or the like, and thus the gap between the doped polysilicon films DPS (the electrode films 61) is filled with this silicon oxide. Then, isotropic wet etching is performed to remove the silicon oxide formed on the inner wall face of the through hole TH and on the inner wall face of the trench where the sacrifice film SFf has been removed and leave the silicon oxide formed in the gap between the doped polysilicon films DPS (the electrode films 61). Thus, the inter-electrode insulating film 62 can be formed also by the silicon oxide left in the gap between the doped polysilicon films DPS (the electrode films 61). After that, the three-layer stacked film 47 is formed on the inner wall face of the through hole TH and on the inner wall face of the trench where the sacrifice film SFf has been removed, and further, the semiconductor pillar SP and the semiconductor connection portion CP are formed. Also such a method can manufacture the nonvolatile semiconductor memory device 110.

Figure 10:
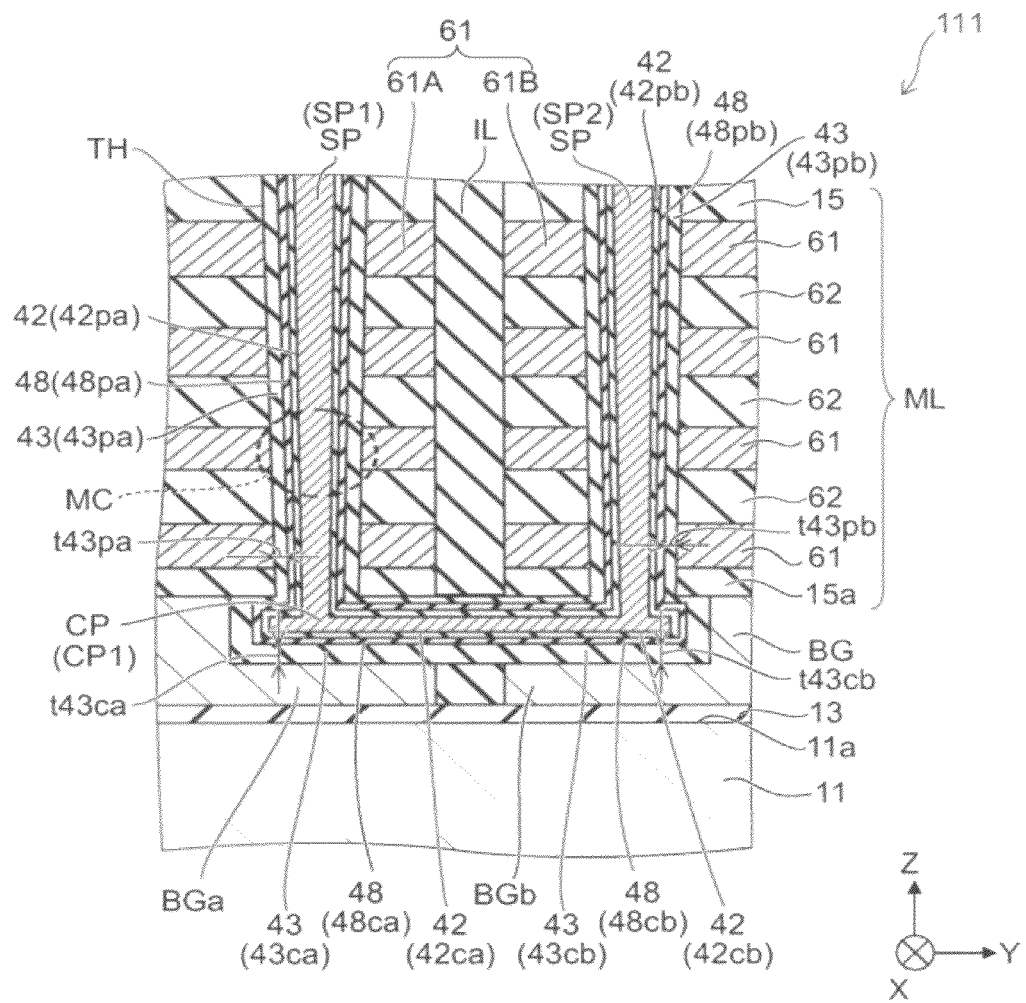
FIG. 10 is a schematic cross-sectional view illustrating the configuration of a part of another nonvolatile semiconductor memory device according to the first embodiment.

FIG. 10 is a schematic cross-sectional view illustrating the configuration of a part of another nonvolatile semiconductor memory device according to the first embodiment.

As illustrated in FIG. 10, in a nonvolatile semiconductor memory device 111, the thickness t43*ca* of the first connection portion outer insulating film 43*ca* and the thickness t43*cb* of the second connection portion outer insulating film 43*cb* are set thicker than the thickness t43*pa* of the first pillar portion outer insulating film 43*pa* and the thickness t43*pb* of the second pillar portion outer insulating film 43*pb*. Other than this, the configuration may be similar to the nonvolatile semiconductor memory device 110, and a description is therefore omitted.

Here, the thickness t43*pa* of the first pillar portion outer insulating film 43*pa* is the thickness of the first pillar portion outer insulating film 43*pa* when the first pillar portion outer insulating film 43*pa* is cut along a plane perpendicular to the Z-axis direction. Similarly, the thickness t43*pb* of the second pillar portion outer insulating film 43*pb* is the thickness of the second pillar portion outer insulating film 43*pb* when the second pillar portion outer insulating film 43*pb* is cut along a plane perpendicular to the Z-axis direction. On the other hand, the thickness t43*ca* of the first connection portion outer insulating film 43*ca* is the thickness of the first connection portion outer insulating film 43*ca* when the first connection portion outer insulating film 43*ca* is cut along a plane perpendicular to the Y-axis direction. Similarly, the thickness t43*cb* of the second connection portion outer insulating film 43*cb* is the thickness of the second connection portion outer insulating film 43*cb* when the second connection portion outer insulating film 43*cb* is cut along a plane perpendicular to the Y-axis direction.

Thus, by setting the thickness of the outer insulating film 43 in the portion of the semiconductor connection portion CP thicker than the thickness of the outer insulating film 43 in the portion of the semiconductor pillar SP, a good operation of the memory cell MC formed in the semiconductor connection portion CP is obtained more easily.

That is, as illustrated in FIG. 4, the shape of the semiconductor pillar SP when cut along the X-Y plane is substantially circle, and the semiconductor pillar SP has a round columnar shape or a cylinder shape. Thereby, in the memory cell MC formed in the semiconductor pillar SP, the curvature radius of the inner insulating film 42 is smaller than the curvature radius of the outer insulating film 43. Thereby, the electric field applied to the inner insulating film 42 is higher than the electric field applied to the outer insulating film 43. That is, the electric field of the inner insulating film 42 (tunneling insulating film) can be raised while keeping the electric field of the outer insulating film 43 (block insulating film) low. This makes it possible to inject electrons into the memory layer 48 (charge storage layer) by using the F-N (Fowler-Nordheim) tunnel current. Thereby, a good operation in the memory cell MC formed in the semiconductor pillar SP is obtained.

On the other hand, the semiconductor connection portion CP is formed by, for example as described in regard to FIG. 6C, forming a trench in the connection portion conductive film BGf (the connection portion conductive layer BG) and burying a semiconductor material in the trench. In the case where the inner wall face of the trench is not a curved face but a flat face, the cross section (e.g. cross section when cut along the X-Z plane) of the semiconductor connection portion CP is, for example, a quadrangle. In this case, the wall face of the semiconductor connection portion CP is a flat face, and also the wall faces of the inner insulating film 42 (the first connection portion inner insulating film 42*ca* and the second connection portion inner insulating film 42*cb*) and the outer insulating film 43 (the first connection portion outer insulating film 43*ca* and the second connection portion outer insulating film 43*cb*) in this portion are flat faces. Therefore, in this portion, the curvature of the inner insulating film 42 (the first connection portion inner insulating film 42*ca* and the second connection portion inner insulating film 42*cb*) is substantially equal to the curvature of the outer insulating film 43 (the first connection portion outer insulating film 43*ca* and the second connection portion outer insulating film 43*cb*). Accordingly, in the semiconductor connection portion CP, the difference in electric field based on the difference in curvature like the semiconductor pillar SP may not be utilized.

At this time, the thickness t43*ca* of the first connection portion outer insulating film 43*ca* and the thickness t43*cb* of the second connection portion outer insulating film 43*cb* may be set thicker than the thickness t43*pa* of the first pillar portion outer insulating film 43*pa* and the thickness t43*pb* of the second pillar portion outer insulating film 43*pb*. Thereby, the electric field applied to the outer insulating film 43 (the first connection portion outer insulating film 43*ca* and the second connection portion outer insulating film 43*cb*) can be easily made lower than the electric field applied to the inner insulating film 42 (the first connection portion inner insulating film 42*ca* and the second connection portion inner insulating film 42*cb*).

That is, in the portion of the semiconductor pillar SP, the difference in electric field based on the difference in curvature is utilized to appropriately set the thicknesses of the inner insulating film 42 and the outer insulating film 43. If the thickness of the outer insulating film 43 thus set is applied also to the outer insulating film 43 in the portion of the semiconductor connection portion CP, a high electric field more than necessary may be applied to the outer insulating film 43 in the portion of the semiconductor connection portion CP, and a desired operation may not be obtained.

At this time, by setting the thickness of the outer insulating film 43 in the portion of the semiconductor connection portion CP thicker than the thickness of the outer insulating film 43 in the portion of the semiconductor pillar SP, a good operation is easily obtained in the memory cell MC formed in the semiconductor pillar SP and the memory cell MC formed in the semiconductor connection portion CP.

The nonvolatile semiconductor memory device 111 like this having a configuration in which the thickness of the outer insulating film 43 in the portion of the semiconductor connection portion CP is thicker than the thickness of the outer insulating film 43 in the portion of the semiconductor pillar SP can be manufactured by, for example, the following method.

FIG. 11A and FIG. 11B and FIG. 12A and FIG. 12B are schematic cross-sectional views in order of the processes, illustrating a method for manufacturing the other nonvolatile semiconductor memory device according to the first embodiment.

These drawings are cross-sectional views when the matrix memory cell unit MU1 is cut along the Y-Z plane, and correspond to, for example, the cross-sectional view along line B-B' of FIG. 1. These drawings omit the circuit unit CU.

Also in this manufacturing method, through the processes described in regard to FIG. 6A to FIG. 6C and FIG. 7A and FIG. 7B, slits reaching the sacrifice films SFf are formed in the doped polysilicon films DPS, the nondoped polysilicon films NPS, and the insulating film 15*a*, and a sacrifice material is buried in the slits to form sacrifice films ILSf in slit shapes. That is, the sacrifice film ILSf in a slit shape is formed in place of the insulating layer IL in a slit shape in FIG. 7B. Then, through the processes described in regard to FIG. 8A and FIG. 8B, the through holes TH are formed and the sacrifice films SFf in the connection portion conductive film BGf are removed.

Figure 11A:
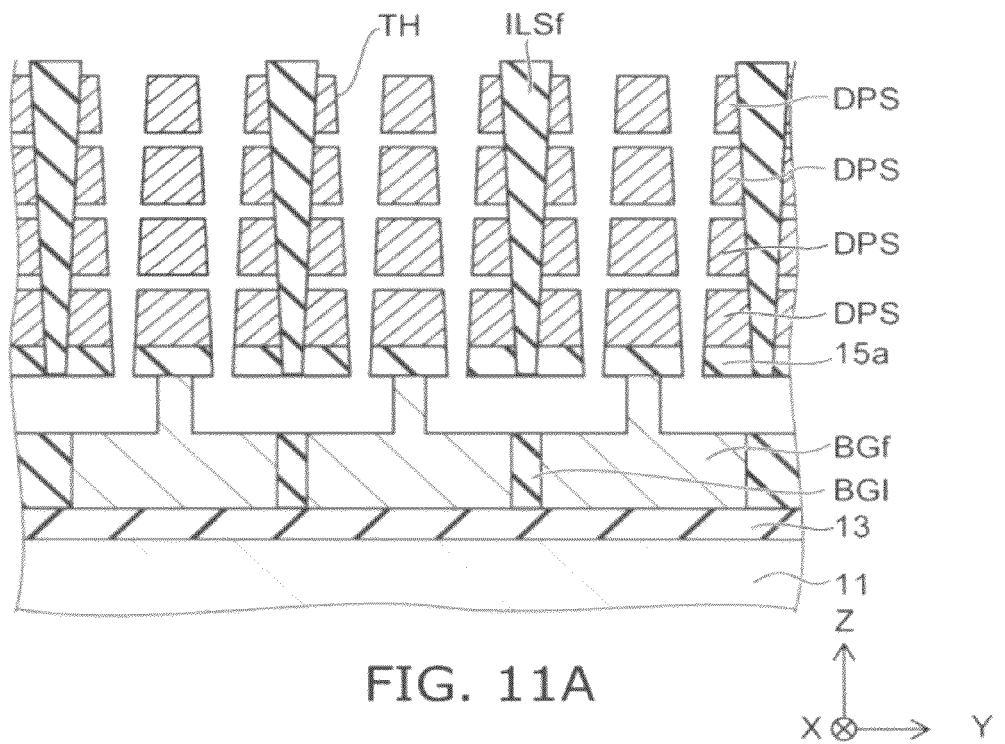
FIG. 11A and FIG. 11B and FIG. 12A and FIG. 12B are schematic cross-sectional views in order of the processes, illustrating a method for manufacturing the another nonvolatile semiconductor memory device according to the first embodiment.

Then, as illustrated in FIG. 11A, the nondoped polysilicon film NPS is exposed to an alkali-based aqueous solution via the through hole TH to remove the nondoped polysilicon film NPS. At this time, the sacrifice film ILSf supports the doped polysilicon films DPS (the electrode films 61) to prevent the stacking structure of the doped polysilicon films DPS (the electrode films 61) from collapsing.

Figure 11B:
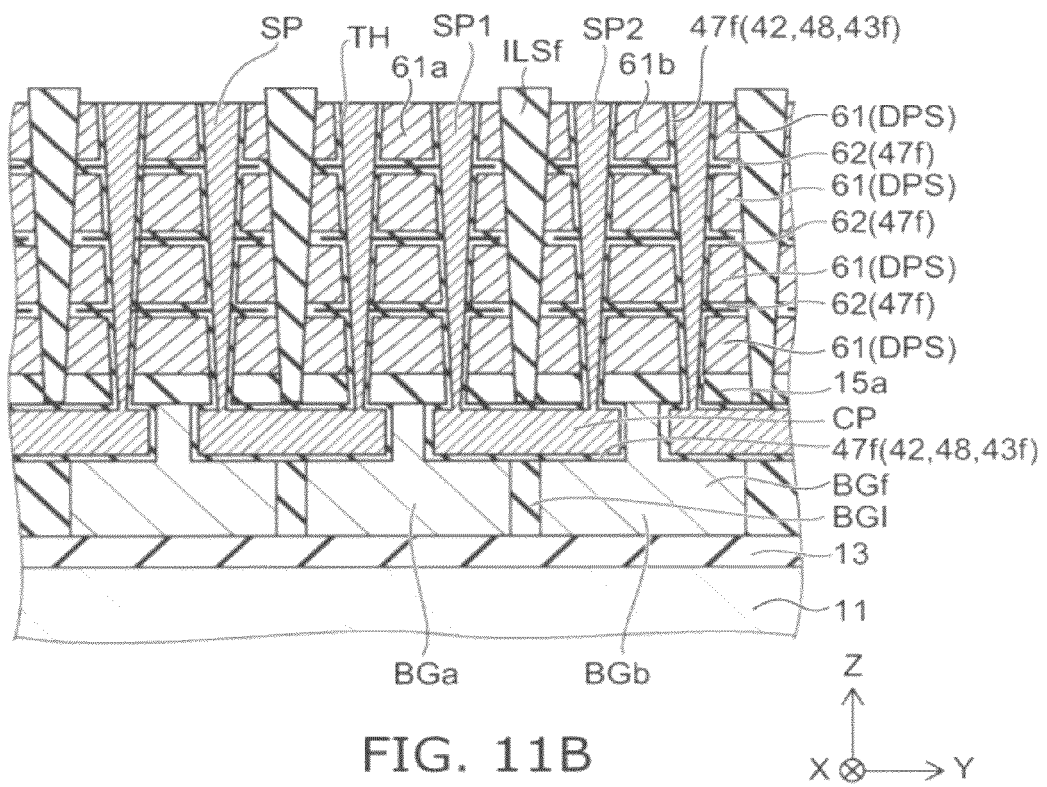

Next, as illustrated in FIG. 11B, the insulating film 43*f*, the memory layer 48, and the inner insulating film 42 are successively deposited on the inner wall face of the through hole TH, on the inner wall face of the trench where the sacrifice film SFf has been removed, and in the gap between the doped polysilicon films DPS (the electrode films 61) to form a three-layer stacked film 47*f*. Thereby, the gap between the doped polysilicon films DPS (the electrode films 61) is filled with the three-layer stacked film 47*f*, and the three-layer stacked film 47*f* in the gap between the doped polysilicon films DPS (the electrode films 61) forms the inter-electrode insulating film 62.

In the portion of the semiconductor pillar SP, the insulating film 43f forms the outer insulating film 43 (the first pillar portion outer insulating film 43pa and the second pillar portion outer insulating film 43pb). In the portion of the semiconductor connection portion CP, the insulating film 43f forms a part of the outer insulating film 43 (the first connection portion outer insulating film 43ca and the second connection portion outer insulating film 43cb).

Figure 12A:
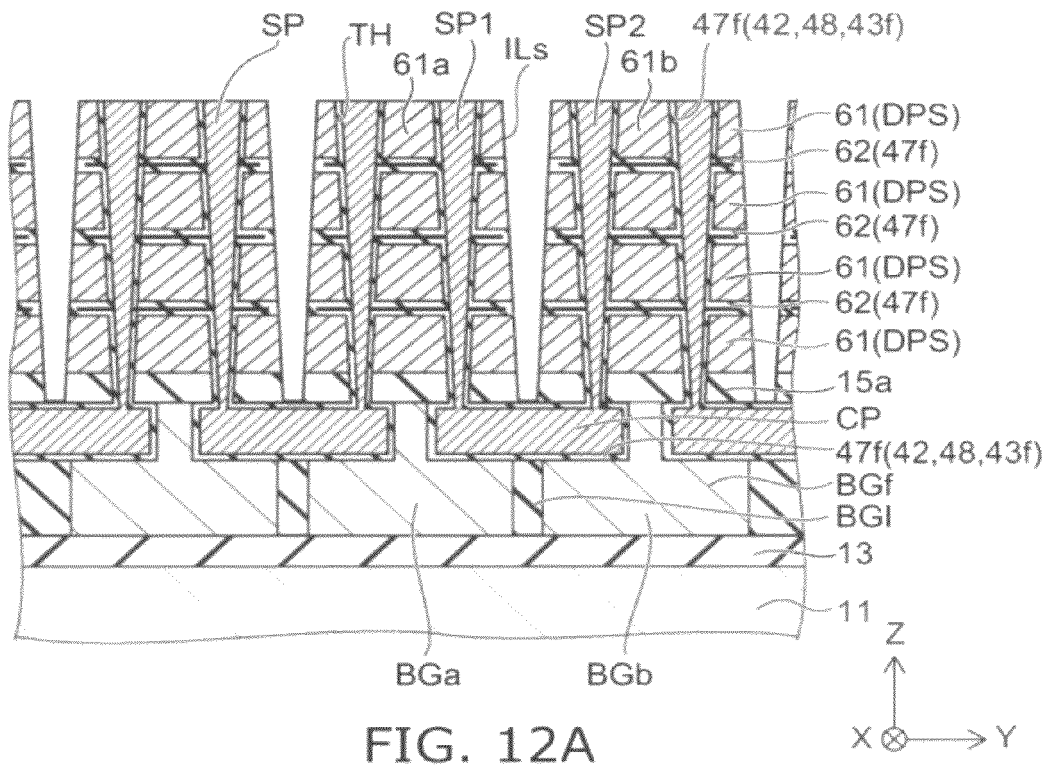

Next, as illustrated in FIG. 12A, the sacrifice films ILSf in slit shapes are removed. Thereby, slits ILs are formed in the stacked structure body ML of the electrode films 61 (the doped polysilicon films DPS) and the inter-electrode insulating films 62 (the three-layer stacked films 47).

Figure 12B:
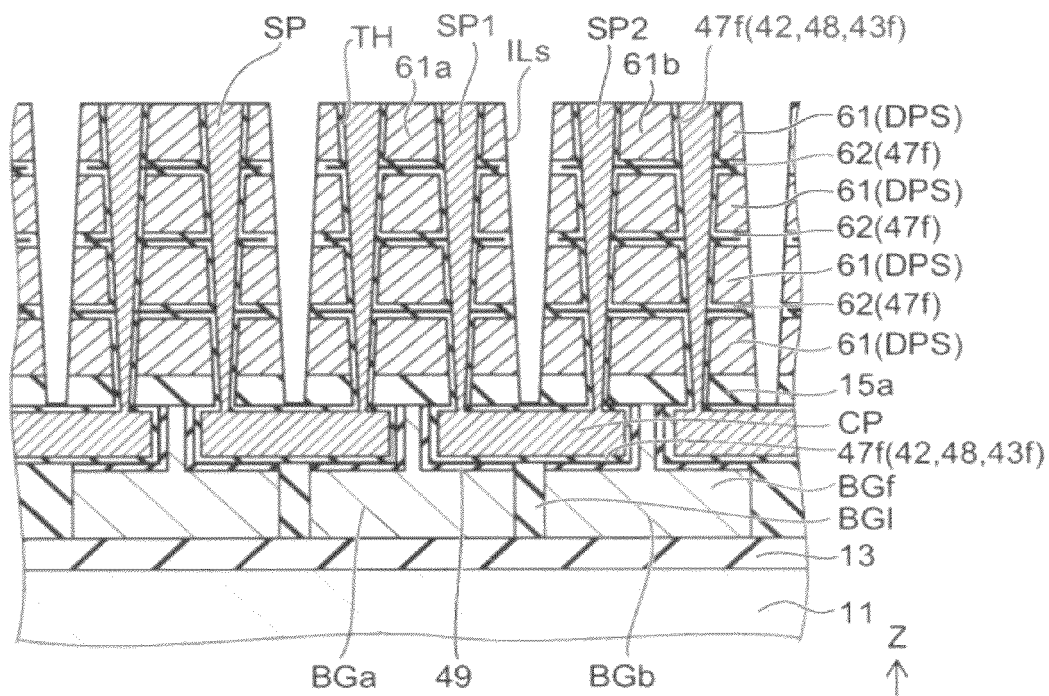

Next, as illustrated in FIG. 12B, an oxidation method that easily performs wedge oxidation such as the wet oxidation method is used via the slit ILs to perform oxidation treatment. This oxidation process oxidizes a portion of the connection portion conductive film BGf on the side opposed to the semiconductor connection portion CP to form the insulating film 49. In the semiconductor connection portion CP, the insulating film 49 constitutes a part of the outer insulating film 43. That is, in the portion of the semiconductor connection portion CP, the thickness of the outer insulating film 43 (the first connection portion outer insulating film 43ca and the second connection portion outer insulating film 43cb) is the total of the thickness of the insulating film 43f of the three-layer stacked film 47f and the thickness of the insulating film 49 formed by the oxidation treatment. On the other hand, in the portion of the semiconductor pillar SP, since the oxidation treatment mentioned above does not form an insulating film, the thickness of the outer insulating film 43 (the first pillar portion outer insulating film 43pa and the second pillar portion outer insulating film 43pb) is the thickness of the insulating film 43f of the three-layer stacked film 47f.

In this way, the insulating film 49 is selectively formed in the portion of the semiconductor connection portion CP. Thereby, the thickness t43ca of the first connection portion outer insulating film 43ca and the thickness t43cb of the second connection portion outer insulating film 43cb can be made thicker than the thickness t43pa of the first pillar portion outer insulating film 43pa and the thickness t43pb of the second pillar portion outer insulating film 43pb.

After that, an insulating material is buried in the slits ILs to form the insulating layers IL, and the select gate electrodes SG, various interconnections, and various interlayer insulating films are formed; thus, the nonvolatile semiconductor memory device 111 can be fabricated.

Thus, by setting the thickness of the outer insulating film 43 in the portion of the semiconductor connection portion CP thicker than the thickness of the outer insulating film 43 in the portion of the semiconductor pillar SP, a good operation is easily obtained in the memory cell MC formed in the semiconductor pillar SP and the memory cell MC formed in the semiconductor connection portion CP.

However, also in the case where the thickness of the outer insulating film 43 in the portion of the semiconductor connection portion CP is set thicker than the thickness of the outer insulating film 43 in the portion of the semiconductor pillar SP, operating characteristics may be different between the memory cell MC formed in the semiconductor pillar SP and the memory cell MC formed in the semiconductor connection portion CP. In this case, a method may be used in which the number of levels of stored data is varied between the memory cell MC formed in the semiconductor connection portion CP and the memory cell MC formed in the semiconductor pillar SP.

That is, the numbers of levels of data stored in the first connection portion memory layer 48ca and the second connection portion memory layer 48cb may be set smaller than the numbers of levels of data stored in the first pillar portion memory layer 48pa and the second pillar portion memory layer 48pb. For example, in the case where the numbers of levels of data stored in the first pillar portion memory layer 48pa and the second pillar portion memory layer 48pb is a multiple value such as not less than three or not less than four, the numbers of levels of date stored in the first connection portion memory layer 48ca and the second connection portion memory layer 48cb may be set to two.

Also in the case where the thickness of the outer insulating film 43 in the portion of the semiconductor connection portion CP is set thicker than the thickness of the outer insulating film 43 in the portion of the semiconductor pillar SP and in the case where, in the portion of the semiconductor connection portion CP, the difference in electric field is not sufficiently high between the inner insulating film 42 and the outer insulating film 43, the numbers of levels of data stored in the first connection portion memory layer 48ca and the second connection portion memory layer 48cb may be set smaller than the numbers of levels of data stored in the first pillar portion memory layer 48pa and the second pillar portion memory layer 48pb. Thereby, a good operation of the memory cell MC formed in the semiconductor connection portion CP can be ensured.

Second Embodiment

Figure 13:
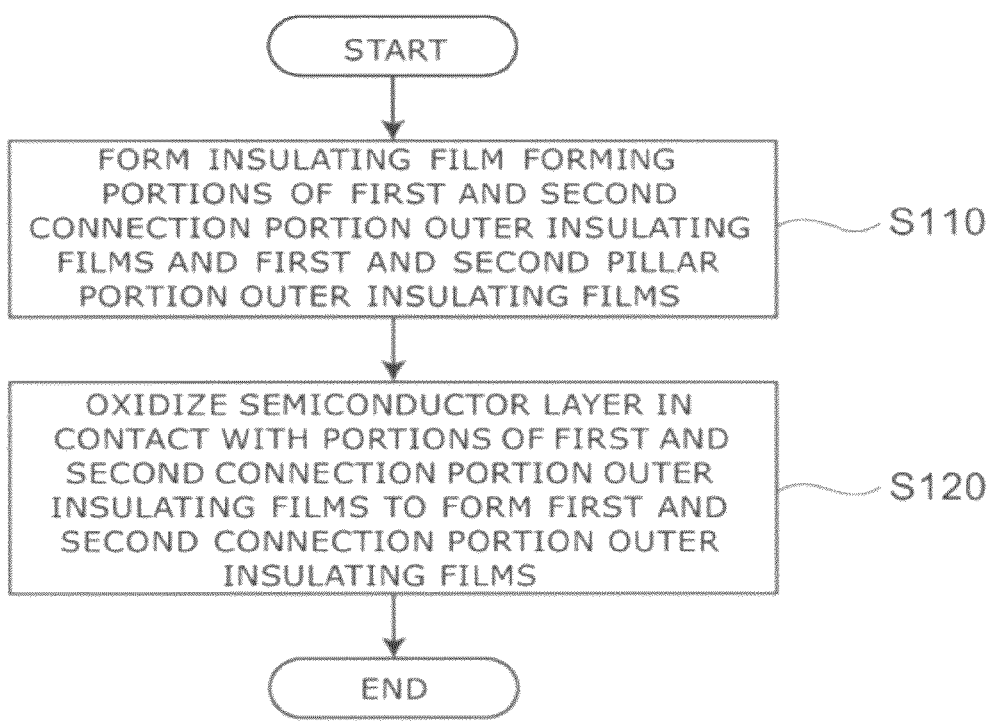
FIG. 13 is a flow chart illustrating a method for manufacturing a nonvolatile semiconductor memory device according to a second embodiment.

FIG. 13 is a flow chart illustrating a method for manufacturing a nonvolatile semiconductor memory device according to a second embodiment.

The method for manufacturing a nonvolatile semiconductor memory device according to this embodiment may be used for the manufacture of the nonvolatile semiconductor memory device 111 illustrated in FIG. 10.

That is, this manufacturing method is a method for manufacturing a nonvolatile semiconductor memory device including: the first stacked structure body ML1 including the plurality of first electrode films 61a and the plurality of first inter-electrode insulating films 62 alternately stacked in the Z-axis direction; the second stacked structure body ML2 adjacent to the first stacked structure body ML1 in the Y-axis direction perpendicular to the Z-axis direction including the plurality of second electrode films 61b and the plurality of second inter-electrode insulating films 62b alternately stacked in the Z-axis direction; the first semiconductor pillar SP1 piercing the first stacked structure body ML1 in the Z-axis direction; the second semiconductor pillar SP2 piercing the second stacked structure body ML2 in the Z-axis direction; the semiconductor connection portion CP connecting one end of the first semiconductor pillar SP1 and one end of the second semiconductor pillar SP2; the first connection portion conductive layer BGa opposed to the first portion of the semiconductor connection portion CP on the first semiconductor pillar SP1 side; the second connection portion conductive layer BGb opposed to the second portion of the semiconductor connection portion on the second semiconductor pillar SP2 side; the first pillar portion memory layer 48pa provided between the plurality of first electrode films 61a and the first semiconductor pillar SP1; the second pillar portion memory layer 48pb provided between the plurality of second electrode films 61b and the second semiconductor pillar SP2; the first connection portion memory layer 48ca provided between the first connection portion conductive layer BGa and the first portion; the second connection portion memory layer 48cb provided between the second connection portion conductive layer BGb and the second portion; the first pillar portion outer insulating film 43pa provided between the first pillar portion memory layer 48pa and the plurality of first electrode films 61a; the second pillar portion outer insulating film 43pb provided between the second pillar portion memory layer 48pb and the plurality of second electrode films 61b; the first connection portion outer insulating film 43ca provided between the first connection portion conductive layer BGa and the first portion; and the second connection portion outer insulating film 43cb provided between the second connection portion conductive layer BGb and the second portion.

As illustrated in FIG. 13, this manufacturing method includes a process (step S110) that forms an insulating film (first insulating film) (e.g. the insulating film 43f illustrated in FIG. 11B), which serves as a part of the first connection portion outer insulating film 43ca, a part of the second connection portion outer insulating film 43cb, the first pillar portion outer insulating film 43pa and the second pillar portion outer insulating film 43pb.

This manufacturing method further includes a process (step S120) that oxides a semiconductor layer (e.g. the first connection portion conductive layer BGa and the second connection portion conductive layer BGb) in contact with the part of the first connection portion outer insulating film 43ca and the part of the second connection portion outer insulating film 43cb to form the first connection portion outer insulating film 43ca and the second connection portion outer insulating film 43cb.

That is, the processings described in regard to FIG. 11A, FIG. 11B, FIG. 12A, and FIG. 12B are performed.

This manufacturing method may further include, for example, a process that forms a first film (e.g. the doped polysilicon film DPS) that forms the first electrode film 61a and the second electrode film 61b and a process that forms a second film (e.g. the nondoped polysilicon film NPS) that forms the first inter-electrode insulating film 62a and the second inter-electrode insulating film 62b. Furthermore, this manufacturing method may further include a process that forms a slit (e.g. a slit in which the insulating layer IL is provided) dividing the first film and the second film mentioned above along the X-axis direction perpendicular to the Z-axis direction and the Y-axis direction. The oxidation mentioned above may be performed via the slit as described in regard to FIG. 12B.

At this time, the first film mentioned above may be the first electrode film 61a and the second electrode film 61b themselves, and the second film mentioned above may be the first inter-electrode insulating film 62a and the second inter-electrode insulating film 62b themselves.

According to this manufacturing method, the thickness of the outer insulating film 43 in the portion of the semiconductor connection portion CP can be set thicker than the thickness of the outer insulating film 43 in the portion of the semiconductor pillar SP, and a good operation can be easily obtained in the memory cell MC formed in the semiconductor pillar SP and the memory cell MC formed in the semiconductor connection portion CP.

Furthermore, as described above, this manufacturing method may further include a process that forms the connection portion conductive film BGf that forms the first connection portion conductive layer BGa and the second connection portion conductive layer BGb on the major surface 11a of the semiconductor substrate 11 (substrate) and a process that forms the connection portion insulating layer BGI that divides the connection portion conductive film BGf along the X-axis direction perpendicular to the Z-axis direction and the Y-axis direction to form the first connection portion conductive layer BGa and the second connection portion conductive layer BGb. That is, the processings described in regard to FIG. 6A and FIG. 6B may be performed.

Thereby, the first connection portion conductive layer BGa and the second connection portion conductive layer BGb can be formed that can be set at electric potentials independent from each other. This can provide a method for manufacturing a nonvolatile semiconductor memory device with a configuration of collectively processed three-dimensionally stacked memory with an increased memory capacity.

Furthermore, as described above, this manufacturing method may further include a process that forms a trench in the connection portion conductive film BGf and the connection portion insulating layer BGI mentioned above and a process that buries the sacrifice film SFf in the trench. That is, the processing described in regard to FIG. 6C may be performed.

Moreover, the process mentioned above that forms the insulating film 43f that forms a part of the first connection portion outer insulating film 43ca, a part of the second connection portion outer insulating film 43cb, the first pillar portion outer insulating film 43pa, and the second pillar portion outer insulating film 43pb may further include forming the insulating film 43f that forms a part of the first connection portion outer insulating film 43ca, a part of the second connection portion outer insulating film 43cb, the first pillar portion outer insulating film 43pa, and the second pillar portion outer insulating film 43pb on the inner wall face of the trench mentioned above. That is, the processing described in regard to FIG. 11B may be performed.

As described above, the embodiment provides a nonvolatile semiconductor memory device with a configuration of a collectively processed three-dimensionally stacked memory with an increased memory capacity and a method for manufacturing the same.

Although the case where silicon nitride is used as the memory layer 48 is described in the above, the embodiment is not limited thereto, but for the memory layer 48, a single layer film of one selected from a group consisting of silicon nitride, silicon oxynitride, aluminum oxide, aluminum oxynitride, hafnia, hafnium aluminate, hafnia nitride, hafnium nitride aluminate, hafnium silicate, hafnium nitride silicate, lanthanum oxide, and lanthanum aluminate or a stacked film formed of two or more selected from the group may be used.

Furthermore, for the inter-electrode insulating film 62, the inner insulating film 42, and the outer insulating film 43, a single layer film of one selected from a group consisting of silicon oxide, silicon nitride, silicon oxynitride, aluminum oxide, aluminum oxynitride, hafnia, hafnium aluminate, hafnia nitride, hafnium nitride aluminate, hafnium silicate, hafnium nitride silicate, lanthanum oxide, and lanthanum aluminate or a stacked film formed of two or more selected from the group may be used.

In the specification of the application, "perpendicular" and "parallel" refer to not only strictly perpendicular and strictly parallel but also include, for example, the variation due to manufacturing processes, etc. It is sufficient to be substantially perpendicular and substantially parallel.

Hereinabove, embodiments of the invention are described with reference to specific examples. However, the invention is not limited to these specific examples. For example, one skilled in the art may appropriately select specific configurations of components of nonvolatile semiconductor memory devices such as electrode films, inter-electrode insulating films, select gate electrodes, semiconductor pillars, semiconductor connection portions, connection portion conductive films, memory layers, inner insulating films, outer insulating films, insulating films, conductive films, interlayer insulating films, source lines, bit lines, and interconnections from known art and similarly practice the invention. Such practice is included in the scope of the invention to the extent that similar effects thereto can be obtained.

Further, any two or more components of the specific examples may be combined within the extent of technical feasibility; and such combinations are included in the scope of the invention to the extent that the purport of the invention is included.

Moreover, all nonvolatile semiconductor memory devices and methods for manufacturing the same practicable by an appropriate design modification by one skilled in the art based on the nonvolatile semiconductor memory devices and the methods for manufacturing the same described above as embodiments of the invention also are within the scope of the invention to the extent that the purport of the invention is included.

Furthermore, various alterations and modifications within the spirit of the invention will be readily apparent to those skilled in the art. All such alterations and modifications should be seen as within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

The invention claimed is:

1. A nonvolatile semiconductor memory device comprising:
   a first stacked structure body including a plurality of first electrode films and a plurality of first inter-electrode insulating films alternately stacked in a first direction;
   a second stacked structure body adjacent to the first stacked structure body in a second direction perpendicular to the first direction including a plurality of second electrode films and a plurality of second inter-electrode insulating films alternately stacked in the first direction;
   a first semiconductor pillar piercing the first stacked structure body in the first direction;
   a second semiconductor pillar piercing the second stacked structure body in the first direction;
   a semiconductor connection portion connecting one end of the first semiconductor pillar and one end of the second semiconductor pillar;
   a first connection portion conductive layer opposed to a first portion of the semiconductor connection portion on the first semiconductor pillar side;
   a second connection portion conductive layer opposed to a second portion of the semiconductor connection portion on the second semiconductor pillar side;
   a first pillar portion memory layer provided between the plurality of first electrode films and the first semiconductor pillar;
   a second pillar portion memory layer provided between the plurality of second electrode films and the second semiconductor pillar;
   a first connection portion memory layer provided between the first connection portion conductive layer and the semiconductor connection portion; and
   a second connection portion memory layer provided between the second connection portion conductive layer and the semiconductor connection portion.

2. The device according to claim 1, wherein a potential of the first connection portion conductive layer can be set independently from a potential of the second connection portion conductive layer.

3. The device according to claim 1, wherein numbers of levels of data stored in the first connection portion memory layer and the second connection portion memory layer are smaller than numbers of levels of data stored in the first pillar portion memory layer and the second pillar portion memory layer.

4. The device according to claim 1, further comprising:
   a first pillar portion inner insulating film provided between the first pillar portion memory layer and the first semiconductor pillar;
   a second pillar portion inner insulating film provided between the second pillar portion memory layer and the second semiconductor pillar;
   a first connection portion inner insulating film provided between the first connection portion memory layer and the first portion; and
   a second connection portion inner insulating film provided between the second connection portion memory layer and the second portion.

5. The device according to claim 1, wherein the plurality of first electrode films and the plurality of second electrode films include a portion extending along a third direction perpendicular to the first direction and the second direction.

6. The device according to claim 1, wherein the first connection portion conductive layer and the second connection portion conductive layer include a portion extending along a third direction perpendicular to the first direction and the second direction.

7. The device according to claim 1, wherein the first electrode film and the second electrode film contain at least one of polysilicon doped with an impurity and amorphous silicon doped with an impurity.

8. The device according to claim 1, wherein the first connection portion conductive layer and the second connection portion conductive layer contain at least one of polysilicon doped with an impurity and amorphous silicon doped with an impurity.

9. The device according to claim 1, wherein the first pillar portion memory layer, the second pillar portion memory layer, the first connection portion memory layer, and the second connection portion memory layer contain silicon nitride.

10. The device according to claim 1, wherein the first inter-electrode insulating film and the second inter-electrode insulating film include a film made of a material used for the first pillar portion memory layer, the second pillar portion memory layer, the first connection portion memory layer, and the second connection portion memory layer.

11. The device according to claim 1, further comprising:
   a first select gate electrode stacked with the first stacked structure body along the first direction and pierced by the first semiconductor pillar;
   a first select gate insulating film provided between the first select gate electrode and the first semiconductor pillar;
   a second select gate electrode stacked with the second stacked structure body along the first direction and pierced by the second semiconductor pillar; and a second select gate insulating film provided between the second select gate electrode and the second semiconductor pillar.

12. The device according to claim 11, wherein the first select gate electrode and the second select gate electrode includes a portion extending along a third direction perpendicular to the first direction and the second direction.

13. The device according to claim 1, further comprising:
a first pillar portion outer insulating film provided between the first pillar portion memory layer and the plurality of first electrode films;
a second pillar portion outer insulating film provided between the second pillar portion memory layer and the plurality of second electrode films;
a first connection portion outer insulating film provided between the first connection portion memory layer and the first connection portion conductive layer; and
a second connection portion outer insulating film provided between the second connection portion memory layer and the second connection portion conductive layer,
thicknesses of the first connection portion outer insulating film and the second connection portion outer insulating film being thicker than thicknesses of the first pillar portion outer insulating film and the second pillar portion outer insulating film.

14. The device according to claim 13, wherein the first pillar portion outer insulating film, the second pillar portion outer insulating film, the first connection portion insulating film, and the second connection portion insulating film contain silicon oxide.

15. The device according to claim 13, wherein the first inter-electrode insulating film and the second inter-electrode insulating film include a film made of a material used for the first pillar portion outer insulating film, the second pillar portion outer insulating film, the first connection portion outer insulating film, and the second connection portion outer insulating film.

16. The device according to claim 13, wherein thicknesses along the first direction of the first inter-electrode insulating film and the second inter-electrode insulating film are smaller than an outer diameter of the first pillar portion outer insulating film and an outer diameter of the second pillar portion outer insulating film.

* * * * *